(12) United States Patent
Noguchi et al.

(10) Patent No.: US 10,290,647 B2
(45) Date of Patent: May 14, 2019

(54) THREE-DIMENSIONAL MEMORY DEVICE CONTAINING STRUCTURALLY REINFORCED PEDESTAL CHANNEL PORTIONS AND METHOD OF MAKING THE SAME

(71) Applicant: SANDISK TECHNOLOGIES LLC, Plano, TX (US)

(72) Inventors: Masato Noguchi, Yokkaichi (JP); Junichi Sato, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/715,629

(22) Filed: Sep. 26, 2017

(65) Prior Publication Data

US 2019/0096904 A1 Mar. 28, 2019

(51) Int. Cl.
*H01L 27/02* (2006.01)
*H01L 27/11582* (2017.01)
(Continued)

(52) U.S. Cl.
CPC .... *H01L 27/11582* (2013.01); *H01L 21/0217* (2013.01); *H01L 21/02211* (2013.01); *H01L 21/31111* (2013.01); *H01L 27/11556* (2013.01); *H01L 21/02164* (2013.01); *H01L 21/02238* (2013.01); *H01L 21/02271* (2013.01);
(Continued)

(58) Field of Classification Search
CPC ......... H01L 27/11582; H01L 21/31111; H01L 27/11556; H01L 21/02211; H01L 21/0217; H01L 29/1054; H01L 21/02271; H01L 27/11565; H01L 21/02274;
(Continued)

(56) References Cited

U.S. PATENT DOCUMENTS 4,538,166 A * 8/1985 Nakano ............. H01L 27/10805
257/297
5,915,167 A 6/1999 Leedy
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Marc Anthony Armand
(74) *Attorney, Agent, or Firm* — The Marbury Law Group, PLLC

(57) ABSTRACT

A source select level silicon nitride layer and an alternating stack of insulating layers and sacrificial silicon nitride layers are formed over a substrate. A memory opening is formed through the alternating stack and the source select level silicon nitride layer. The source select level silicon nitride layer is laterally recessed farther than the sacrificial silicon nitride layers employing an isotropic etch process. A pedestal channel portion including a laterally protruding annular portion is formed at a bottom region of the memory opening. A memory stack structure is formed on the pedestal channel portion in the memory opening. The source select level silicon nitride layer and the sacrificial silicon nitride layers are replaced with a source select level electrically conductive layer and word line electrically conductive layers, respectively.

12 Claims, 24 Drawing Sheets

(51) Int. Cl.
*H01L 21/02* (2006.01)
*H01L 27/11556* (2017.01)
*H01L 21/311* (2006.01)
*H01L 29/10* (2006.01)
*H01L 29/423* (2006.01)
*H01L 21/28* (2006.01)
*H01L 27/11519* (2017.01)
*H01L 27/11565* (2017.01)

(52) U.S. Cl.
CPC ... *H01L 21/02274* (2013.01); *H01L 21/28211* (2013.01); *H01L 27/11519* (2013.01); *H01L 27/11565* (2013.01); *H01L 29/1054* (2013.01); *H01L 29/42364* (2013.01)

(58) Field of Classification Search
CPC ......... H01L 27/11519; H01L 21/02164; H01L 21/28211; H01L 21/022
USPC ...................................................... 257/314
See application file for complete search history.

(56) References Cited

U.S. PATENT DOCUMENTS

| | | | |
|---|---|---|---|
| 8,680,604 | B2 | 3/2014 | Higashi et al. |
| 8,981,466 | B2 * | 3/2015 | Grill ............... H01L 21/76283 257/330 |
| 9,023,719 | B2 | 5/2015 | Pachamuthu et al. |
| 9,035,372 | B2 | 5/2015 | Song |
| 9,230,973 | B2 | 1/2016 | Pachamuthu et al. |
| 9,230,979 | B1 | 1/2016 | Pachamuthu et al. |
| 9,230,980 | B2 | 1/2016 | Rabkin et al. |
| 9,230,987 | B2 | 1/2016 | Pachamuthu et al. |
| 9,246,088 | B2 | 1/2016 | Yamamoto et al. |
| 9,356,043 | B1 | 5/2016 | Sakakibara et al. |
| 9,455,263 | B2 | 9/2016 | Zhang et al. |
| 9,478,558 | B2 | 10/2016 | Koka et al. |
| 9,484,357 | B2 | 11/2016 | Makala et al. |
| 9,524,976 | B2 | 12/2016 | Pachamuthu et al. |
| 9,576,967 | B1 | 2/2017 | Kimura et al. |
| 9,659,956 | B1 | 5/2017 | Pachamuthu et al. |
| 9,685,452 | B2 * | 6/2017 | Lee ................. H01L 27/11582 |
| 2006/0102586 | A1 | 5/2006 | Lee et al. |
| 2007/0252201 | A1 | 11/2007 | Kito et al. |
| 2012/0199897 | A1 | 8/2012 | Chang et al. |
| 2013/0161821 | A1 | 6/2013 | Hwang et al. |
| 2014/0054676 | A1 | 2/2014 | Nam et al. |
| 2014/0198553 | A1 | 7/2014 | Lung |
| 2014/0284691 | A1 | 9/2014 | Takamura et al. |
| 2015/0104916 | A1 | 4/2015 | Lee et al. |
| 2015/0115348 | A1 | 4/2015 | Nam et al. |
| 2015/0179660 | A1 | 6/2015 | Yada et al. |
| 2015/0294978 | A1 | 10/2015 | Lu et al. |
| 2015/0348984 | A1 | 12/2015 | Yada et al. |
| 2016/0056169 | A1 | 2/2016 | Lee et al. |
| 2016/0099289 | A1 | 4/2016 | Yamato et al. |
| 2016/0111432 | A1 | 4/2016 | Rabkin et al. |
| 2016/0141294 | A1 | 5/2016 | Peri et al. |
| 2016/0268209 | A1 | 9/2016 | Pachamuthu et al. |
| 2016/0329101 | A1 | 11/2016 | Sakakibara |
| 2016/0329343 | A1 | 11/2016 | Pachamuthu et al. |
| 2016/0379989 | A1 | 12/2016 | Sharangpani et al. |
| 2017/0125437 | A1 | 5/2017 | Pachamuthu et al. |
| 2017/0125438 | A1 | 5/2017 | Pachamuthu et al. |

OTHER PUBLICATIONS

Wong et al., "Wafer Temperature Dependence of the Vapor-Phase HF Oxide Etch," J. Electrochem., Soc., vol. 140, No. 1, pp. 205-208 (1993).

H. Seidel, J. Electrochem. Soc., vol. 137, No. 11 (1990), "Anisotropic Etching of Crystalline Silicon in Alkaline Solutions".

Matsumura, et al., "Formation of Silicon Nitride Film by HCD Ion Plating Process and its Properties", J. Japan Inst. Metals, Vo. 47, No. 11 (1983) pp. 991-997.

U.S. Appl. No. 15/071,575, filed Mar. 16, 2016, Sandisk Technologies LLC.

U.S. Appl. No. 15/183,195, filed Jun. 15, 2016, Sandisk Technologies LLC.

U.S. Appl. No. 15/186,768, filed Jun. 20, 2016, Sandisk Technologies LLC.

U.S. Appl. No. 15/226,132, filed Aug. 2, 2016, Sandisk Technologies LLC.

U.S. Appl. No. 15/296,380, filed Oct. 18, 2016, Sandisk Technologies LLC.

U.S. Appl. No. 15/347,101, filed Nov. 9, 2016, Sandisk Technologies LLC.

U.S. Appl. No. 15/401,426, filed Jan. 9, 2017, Sandisk Technologies LLC.

U.S. Appl. No. 15/626,766, filed Jun. 19, 2017, Sandisk Tehcnologies LLC.

* cited by examiner

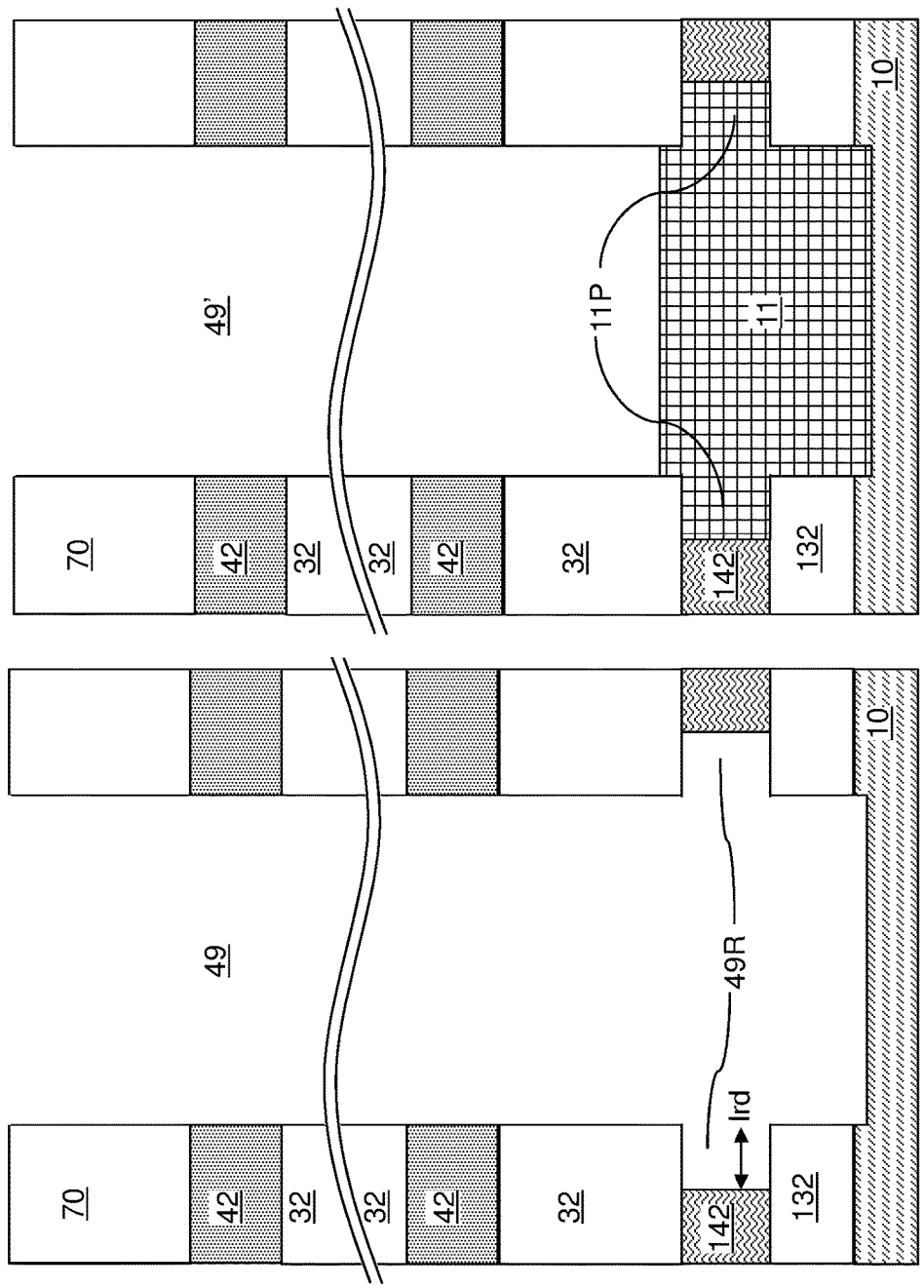

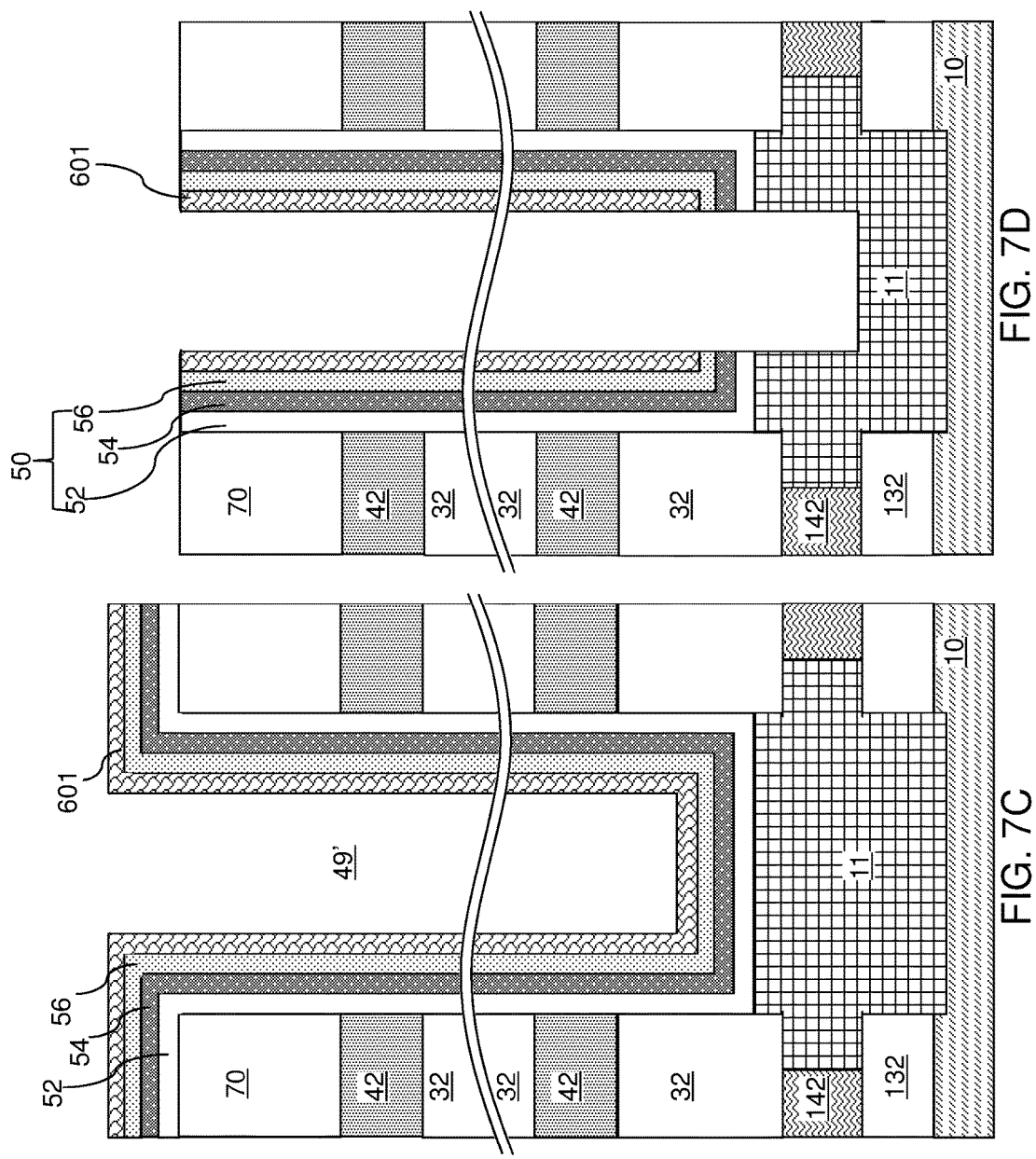

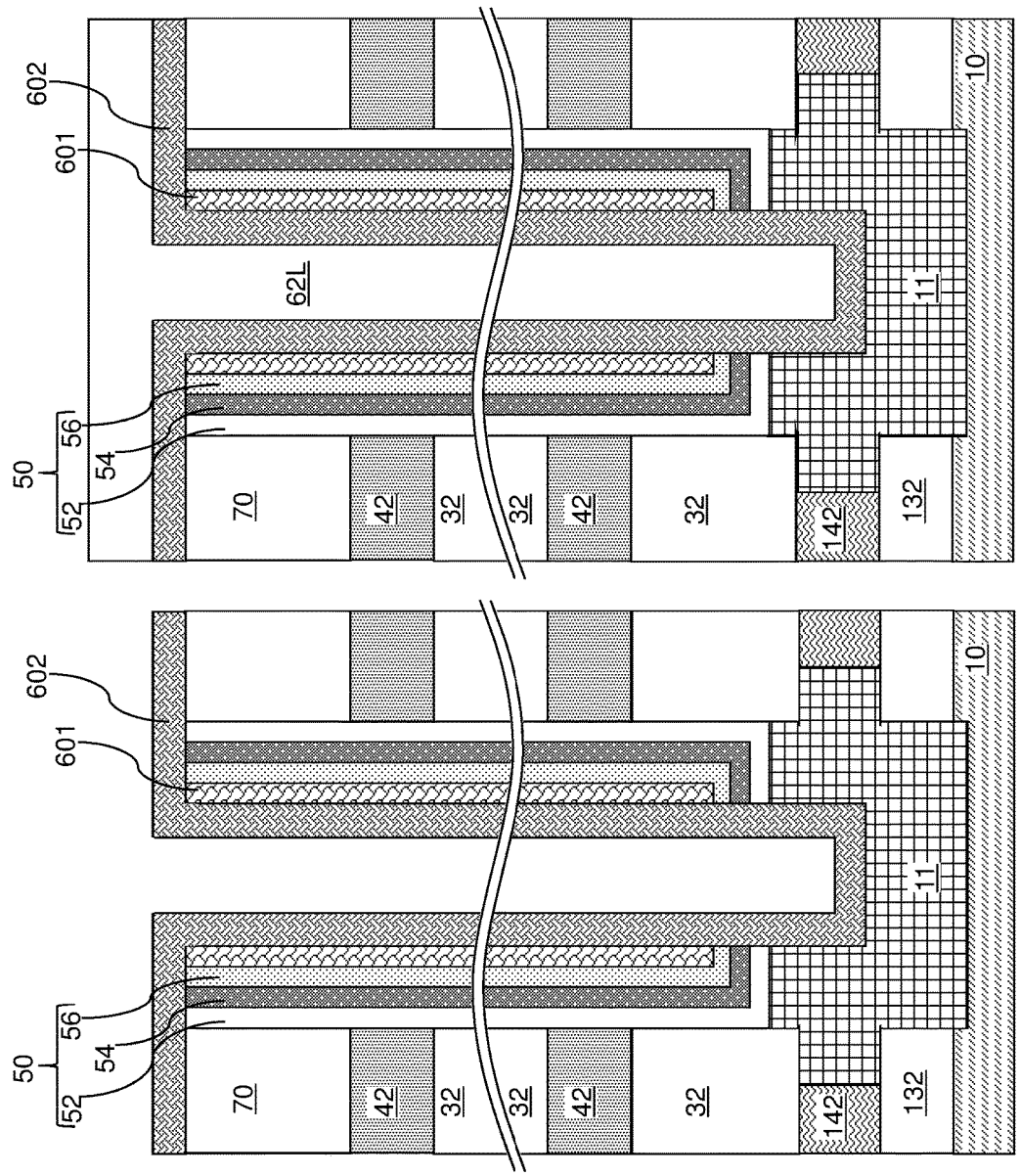

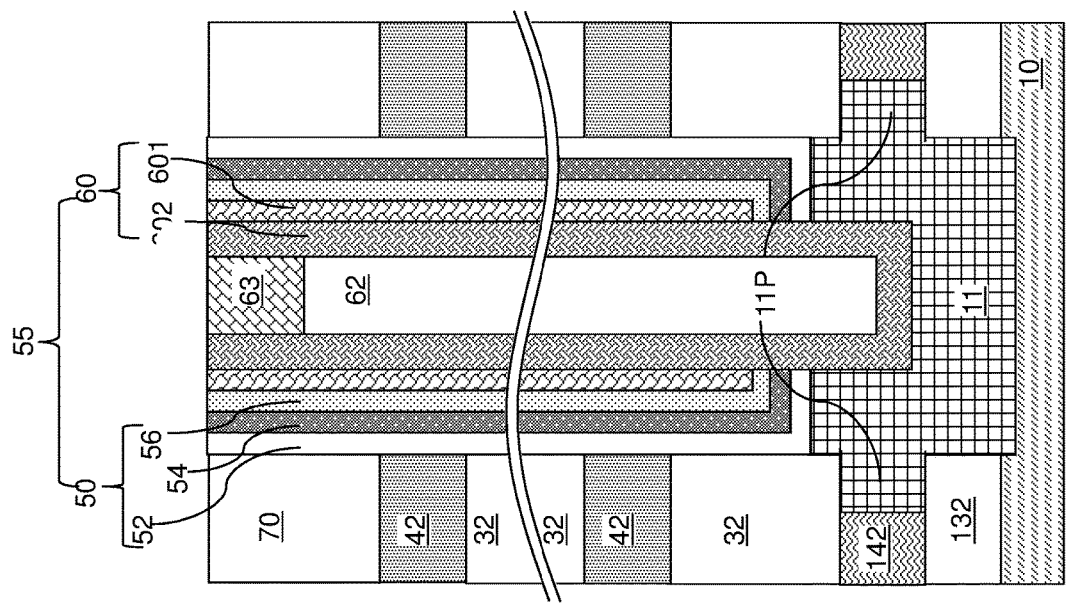
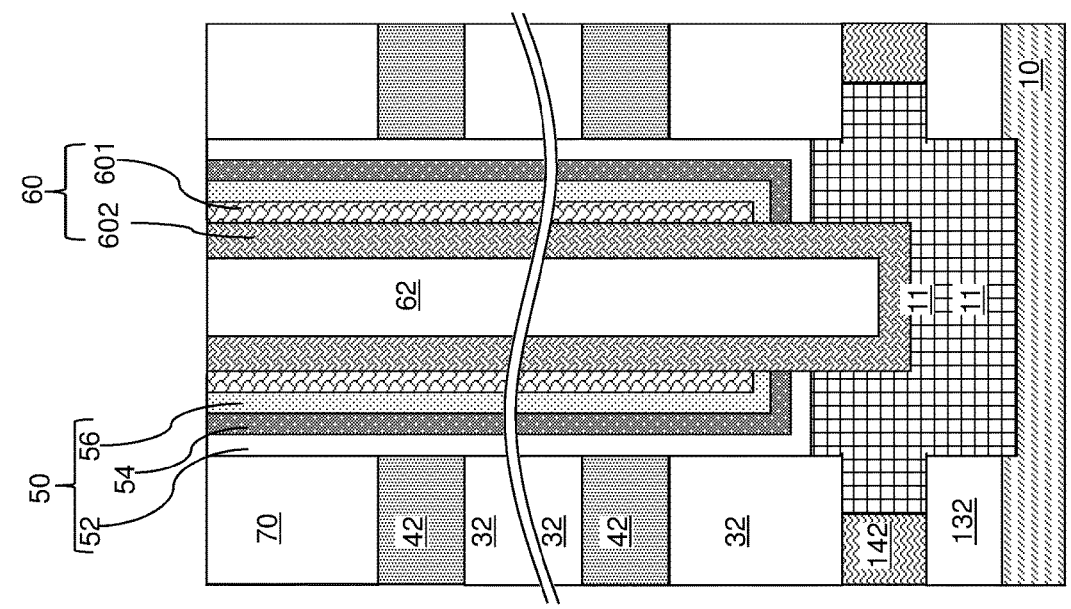

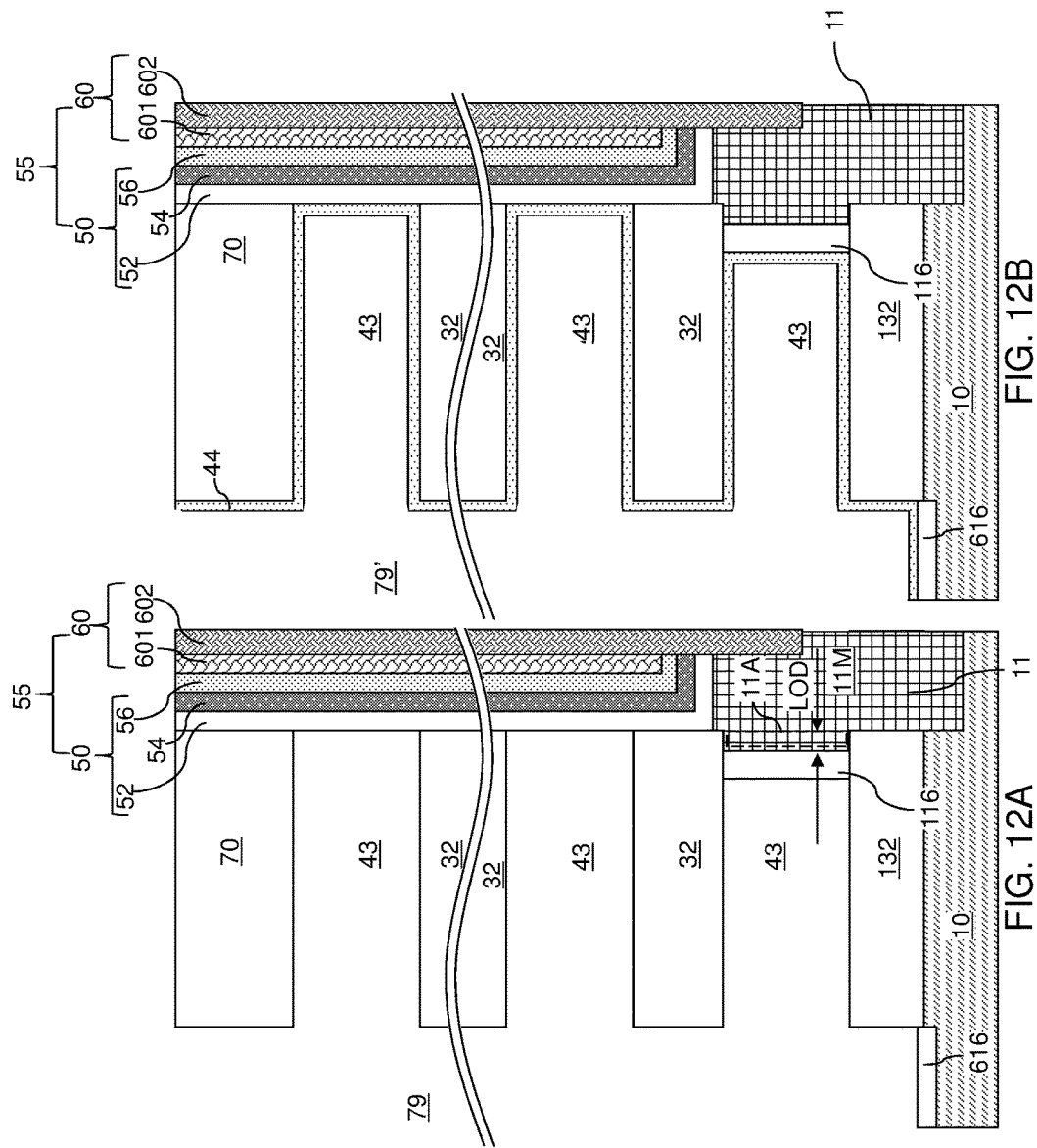

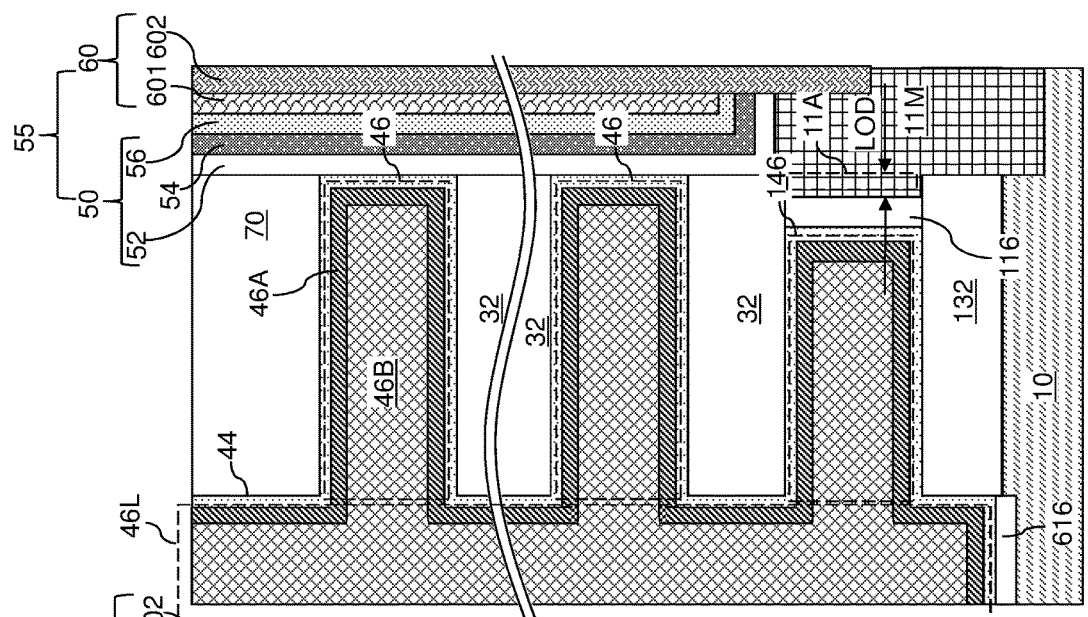
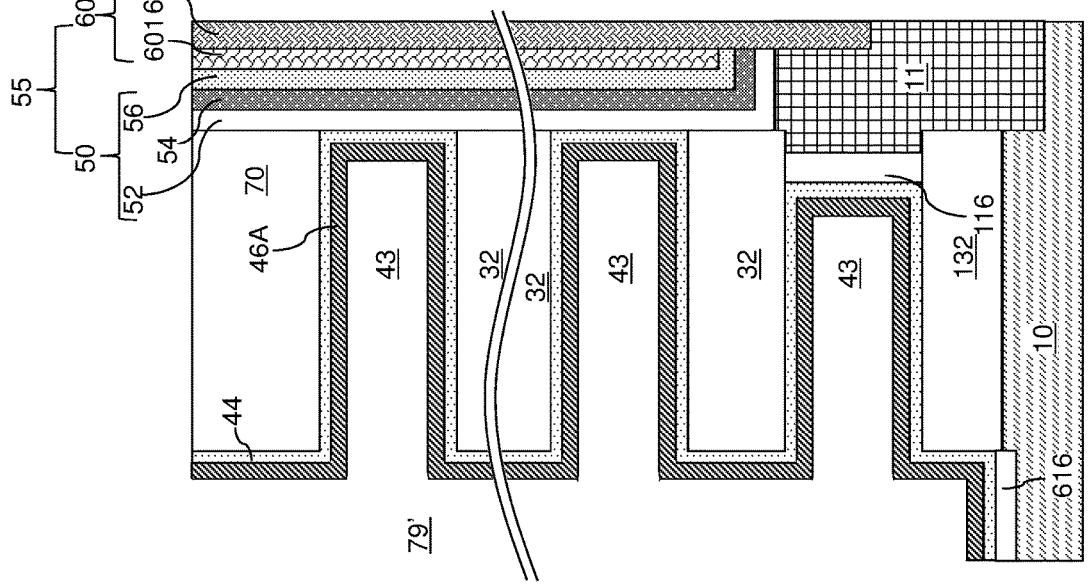

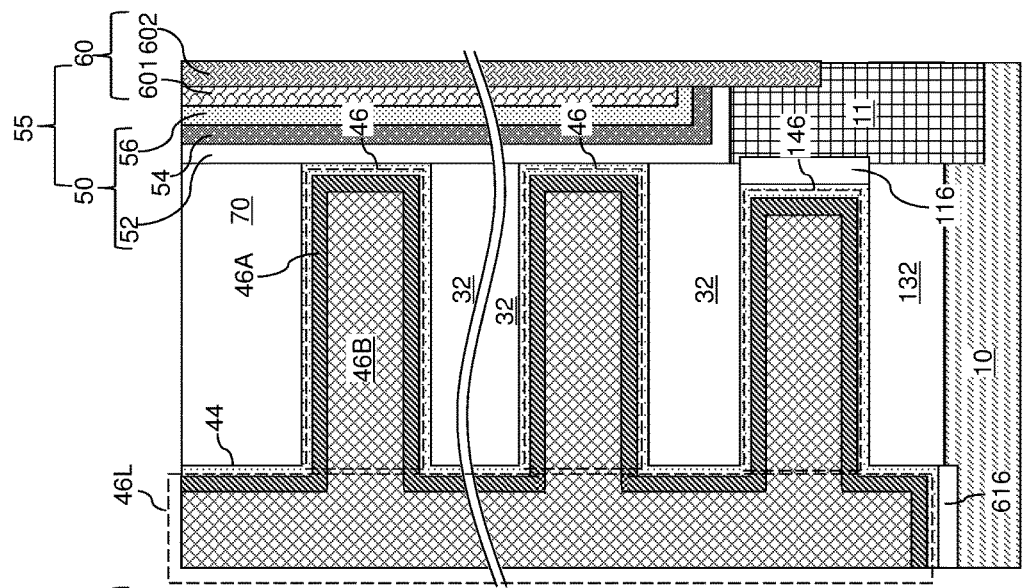
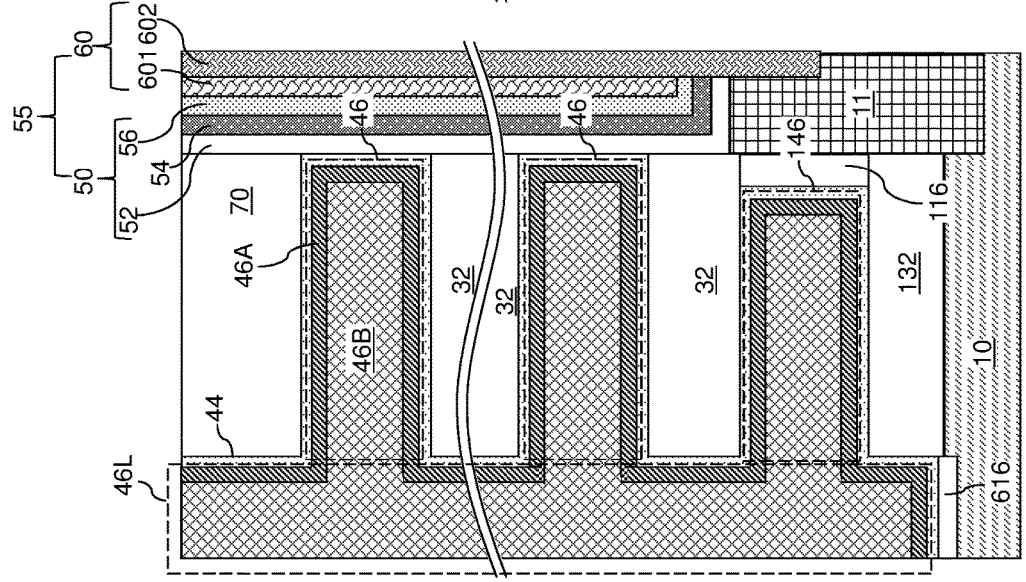

THREE-DIMENSIONAL MEMORY DEVICE CONTAINING STRUCTURALLY REINFORCED PEDESTAL CHANNEL PORTIONS AND METHOD OF MAKING THE SAME

FIELD

The present disclosure relates generally to the field of semiconductor devices, and particular to a three-dimensional memory device employing structurally reinforced pedestal channel portions and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to another aspect of the present disclosure, a method of forming a three-dimensional memory device is provided, which comprises the steps of: forming a source select level silicon nitride layer including a first silicon nitride material over a substrate; forming an alternating stack of insulating layers and sacrificial silicon nitride layers including a second silicon nitride material over the source select level silicon nitride layer; forming a memory opening through the alternating stack and the source select level silicon nitride layer; laterally recessing a sidewall of the source select level silicon nitride layer farther than sidewalls of the sacrificial silicon nitride layers employing an isotropic etch process that etches the first silicon nitride material at a greater etch rate than the second silicon nitride material; forming a pedestal channel portion at a bottom region of the memory opening, wherein the pedestal channel portion contacts a remaining portion of the source select level silicon nitride layer; forming a memory stack structure on the pedestal channel portion in the memory opening, wherein the memory stack structure comprises a memory film and a vertical semiconductor channel located inside the memory film; and replacing the source select level silicon nitride layer and the sacrificial silicon nitride layers with a source select level electrically conductive layer and word line electrically conductive layers, respectively.

According to an aspect of the present disclosure, a three-dimensional memory device is provided, which comprises: a source select level electrically conductive layer located over a substrate; an alternating stack of insulating layers and word line electrically conductive layers located over the source select level electrically conductive layer; a memory opening extending through the alternating stack and the source select level electrically conductive layer, wherein sidewalls of the memory opening include sidewalls of the insulating layers; a pedestal channel portion located at a bottom region of the memory opening comprising a semiconductor material and contacting a top surface of a horizontal semiconductor channel located over or in the substrate, wherein the pedestal channel portion comprises a main portion and a unitary laterally protruding annular portion that laterally protrudes farther outward than the sidewalls of the insulating layers; and a memory stack structure located in the memory opening and contacting a top surface of the pedestal channel portion, wherein the memory stack structure comprises a memory film and a vertical semiconductor channel located inside the memory film.

BRIEF DESCRIPTION OF THE DRAWINGS

FIGS. 7A-7H are sequential schematic vertical cross-sectional views of a memory opening within the exemplary structure during formation of a memory opening fill structure according to an embodiment of the present disclosure.

FIGS. 12A-12D are schematic vertical cross-sectional views of a region of the exemplary structure during formation of electrically conductive layers according to an embodiment of the present disclosure.

FIGS. 12E and 12F are schematic vertical cross-sectional views of alternative embodiments of the exemplary structure according to an embodiment of the present disclosure.

DETAILED DESCRIPTION

Figure 1:
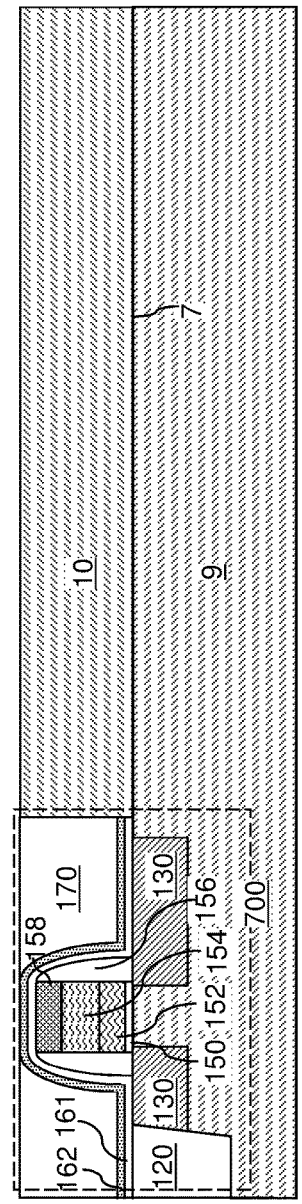
FIG. 1 is a schematic vertical cross-sectional view of an exemplary structure after formation of at least one peripheral device, a semiconductor material layer, and a gate dielectric layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a single memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment, the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
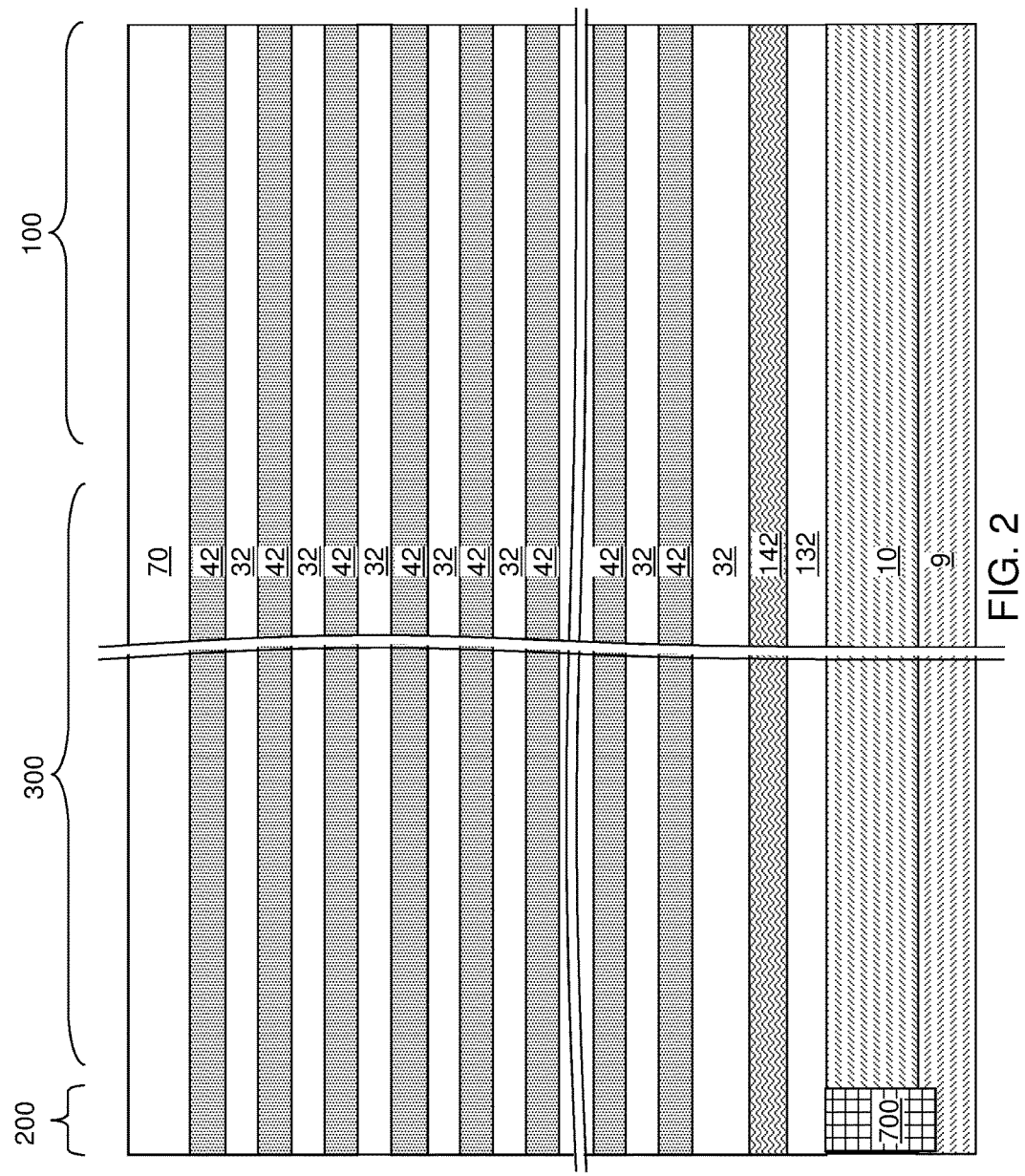
FIG. 2 is a schematic vertical cross-sectional view of the exemplary structure after formation of a source select level silicon nitride layer and an alternating stack of insulating layers and sacrificial silicon nitride layers according to an embodiment of the present disclosure.

Referring to FIG. 2, an insulating base layer 132, a source select level silicon nitride layer 142, an alternating stack of insulating layers 32 and sacrificial silicon nitride layers 42, and an insulating cap layer 70 can be sequentially formed over the semiconductor substrate (9, 10) that includes the substrate semiconductor layer 9 and the optional semiconductor material layer 10.

The insulating base layer 132 includes an electrically insulating material such as silicon oxide. For example, undoped silicate glass or doped silicate glass can be employed for the insulating base layer 132. The thicknesses of the insulating base layer 132 can be in a range from 20 nm to 50 nm, although lesser and greater thicknesses can be employed. The insulating base layer 132 can be deposited by a conformal or non-conformal deposition process.

The source select level silicon nitride layer 142 is formed at a level at which source select gate electrodes are to be subsequently formed. The source select level silicon nitride layer 142 includes a first silicon nitride material. The first silicon nitride material has a higher etch rate in a silicon nitride selective etchant than a second silicon nitride material to be subsequently employed for the sacrificial silicon nitride layers 42 of the alternating stack (32, 42). In one embodiment, the first silicon nitride material can have a higher etch rate in dilute hydrofluoric acid than nitride deposited by low pressure chemical vapor deposition (LPCVD) employing silane or dichlosilane by a factor of 1.2 or a greater number, such as a factor of 2 to 4. For example, the source select level silicon nitride layer 142 can be formed by low pressure chemical vapor deposition (LPCVD) employing hexachlorodisilane (HCD; $Si_2Cl_6$) as a reactant or by plasma enhanced chemical vapor deposition (PECVD) process.

The alternating stack of insulating layers 32 and sacrificial silicon nitride layers 42 is formed on the source select level silicon nitride layer 142. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The insulating layers 32 include an electrically insulating material. The electrically insulating material of the insulating layers 32 is selected such that silicon nitride can be removed selective to the electrically insulating material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The material of the insulating layers 32 can be, for example, silicon oxide (including doped or undoped silicate glass), silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 32 can include silicon oxide.

The sacrificial silicon nitride layers 42 include a second silicon nitride material, which has a lower etch rate in dilute hydrofluoric acid than the first silicon nitride material of the source select level silicon nitride layer 142. The thicknesses of the insulating layers 32 and the sacrificial silicon nitride layers 42 can be in a range from 20 nm to 50 nm, although lesser and greater thicknesses can be employed for each insulating layer 32 and for each sacrificial silicon nitride layer 42. The number of repetitions of the pairs of an insulating layer 32 and a sacrificial silicon nitride layer 42 can be in a range from 2 to 1,024, and typically from 8 to 256, although a greater number of repetitions can also be employed. In one embodiment, each sacrificial silicon nitride layer 42 in the alternating stack (32, 42) can have a uniform thickness that is substantially invariant within each respective sacrificial silicon nitride layer 42.

The second silicon nitride material of the sacrificial silicon nitride layer 42 differs in at least one of structure (e.g., microstructure and/or porosity) and/or composition from the first silicon nitride material of the source select level silicon nitride layer 142. In one embodiment, the first silicon nitride material and the second silicon nitride material can be selected such that an isotropic etch process exists for which the ratio of the etch rate of the first silicon nitride material of the source select level silicon nitride layer 142 in the isotropic etch process to an etch rate of the second silicon nitride material in the isotropic etch process is greater than 1.5. In one embodiment, the isotropic etch process can be a wet etch process employing dilute hydrofluoric acid.

In one embodiment, the source select level silicon nitride layer 142 can be formed by low pressure chemical vapor deposition (LPCVD) process that employs hexachlorodisilane ($Si_2Cl_6$) and ammonia ($NH_3$) as reactants, and the sacrificial silicon nitride layers 42 can be formed by a deposition process such as a plasma enhanced chemical vapor deposition process and a low pressure chemical vapor deposition process. The first silicon nitride material deposited in a low pressure chemical vapor deposition (LPCVD) process employing hexachlorodisilane ($Si_2Cl_6$) as a silicon source and ammonia ($NH_3$) as a nitrogen source has a significant higher etch rate in dilute hydrofluoric acid than the second silicon nitride material deposited in plasma enhanced chemical vapor deposition process employing silane ($SiH_4$) or dichlorosilane ($SiH_2Cl_2$) and ammonia as reactants. The first silicon nitride material can have a higher etch rate in dilute hydrofluoric acid than silicon nitride materials formed by a plasma enhanced chemical vapor deposition process or a low pressure chemical vapor deposition process. As used herein, a dilute hydrofluoric acid refers to the 100:1 mix in volume of deionized water and 49% hydrofluoric acid. In this case, the etch rate of the source select level silicon nitride layer 142 in the dilute hydrofluoric acid can be greater than the etch rate of the sacrificial silicon nitride layers 42 in the dilute hydrofluoric acid by at least 20%, at least 50%, at least 80%, and or at least 100%, such as 20 to 400%, for example 150 to 370% of the etch rate sacrificial silicon nitride layers 42 in dilute hydrofluoric acid.

In another embodiment, the source select level silicon nitride layer 142 can be formed by a first plasma enhanced chemical vapor deposition process, and the sacrificial silicon nitride layers 42 can be formed by a second plasma enhanced chemical vapor deposition process that provides a higher deposition rate than the first plasma enhanced chemical vapor deposition process. In this case, the etch rate of the source select level silicon nitride layer 142 in dilute hydrofluoric acid can be greater than the etch rate of the sacrificial silicon nitride layers 42 in dilute hydrofluoric acid by at least 20%, at least 35%, at least 50%, and/or at least 80%, such as 20 to 400%, for example 100 to 370% of the etch rate sacrificial silicon nitride layers 42 in dilute hydrofluoric acid.

In another embodiment, the source select level silicon nitride layer 142 can be formed by a plasma enhanced chemical vapor deposition process, and the sacrificial silicon nitride layers 42 can be formed by a low pressure chemical vapor deposition process. In this case, the etch rate of the source select level silicon nitride layer 142 in dilute hydrofluoric acid can be greater than the etch rate of the sacrificial silicon nitride layers 42 in dilute hydrofluoric acid by at least 20%, at least 35%, at least 50%, and/or at least 80%, such as 20 to 400%, for example 150 to 370% of the etch rate sacrificial silicon nitride layers 42 in dilute hydrofluoric acid.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
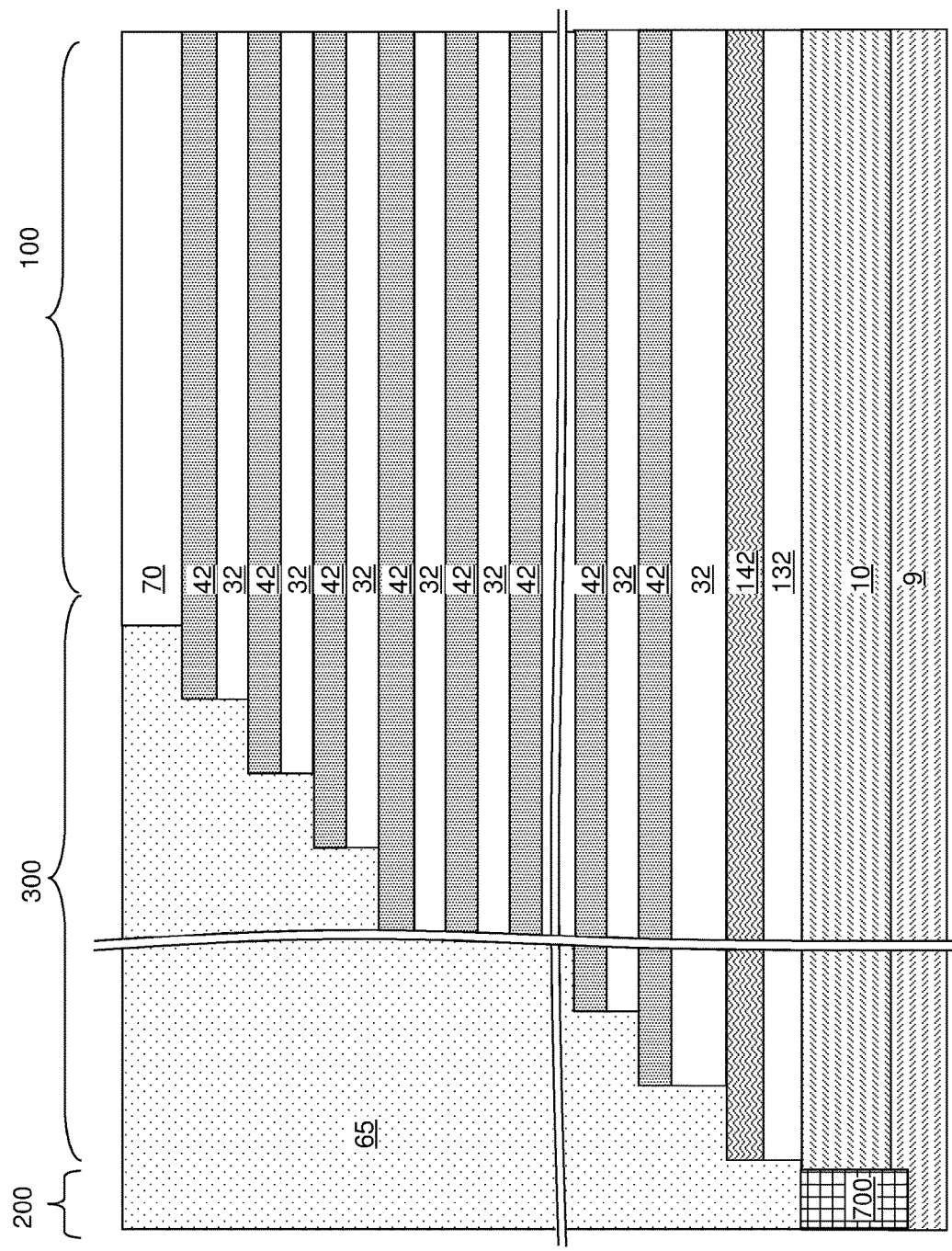
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region (e.g., memory plane) 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

The region of the stepped cavity and the stepped surfaces is referred to as a terrace region. Each sacrificial silicon nitride layer 42 other than a topmost sacrificial silicon nitride layer 42 within the alternating stack (32, 42) laterally extends farther than any overlying sacrificial silicon nitride layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42). The source select level silicon nitride layer 142 and the insulating base layer 132 can be patterned to extend the stepped surfaces to the top surface of the substrate (9, 10).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures (not shown) can be formed through the insulating cap layer 70 and a subset of the sacrificial silicon nitride layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4:
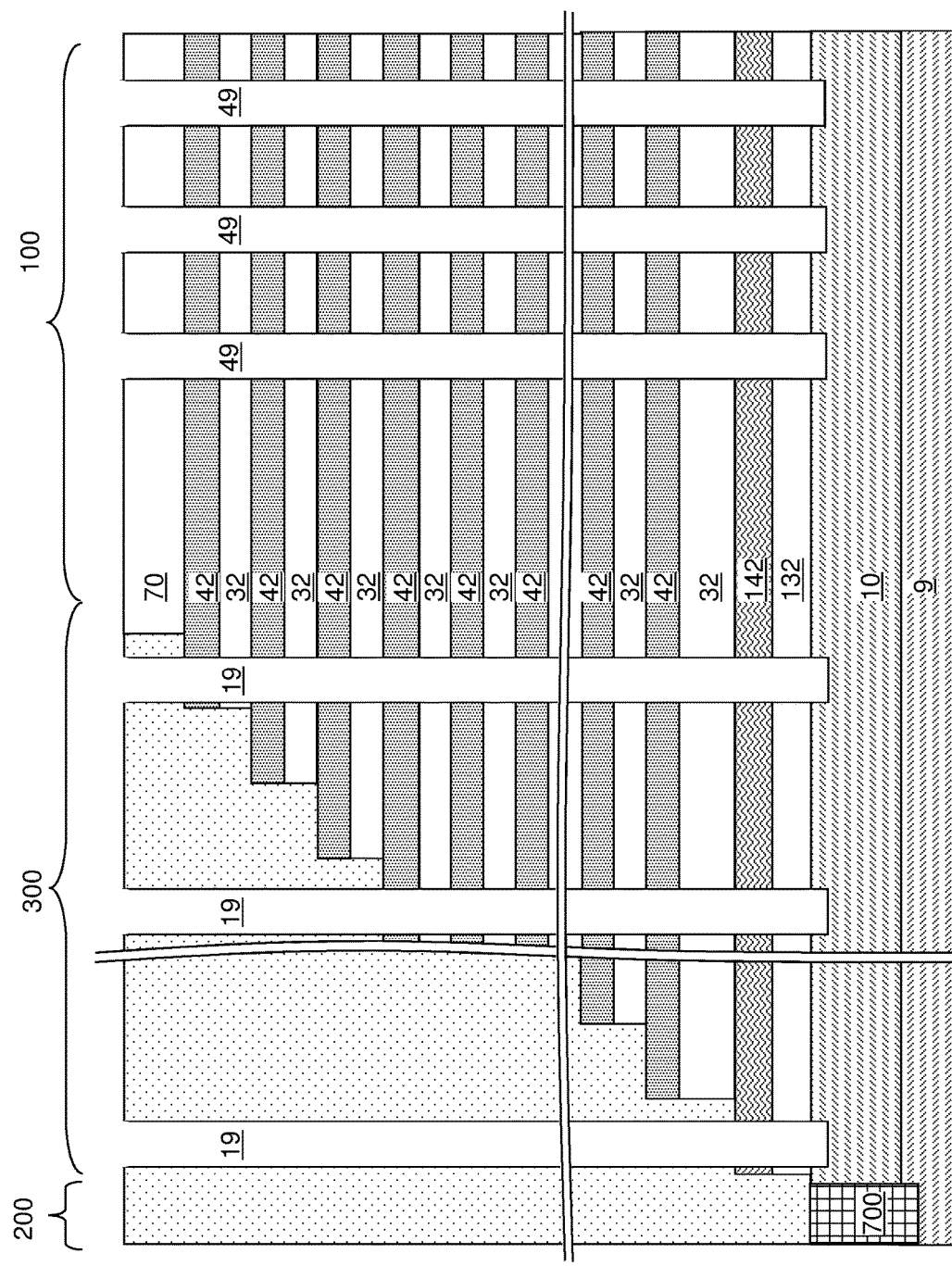
FIG. 4 is a schematic vertical cross-sectional view of the exemplary structure after formation of memory openings and support openings according to an embodiment of the present disclosure.
Figure 5:
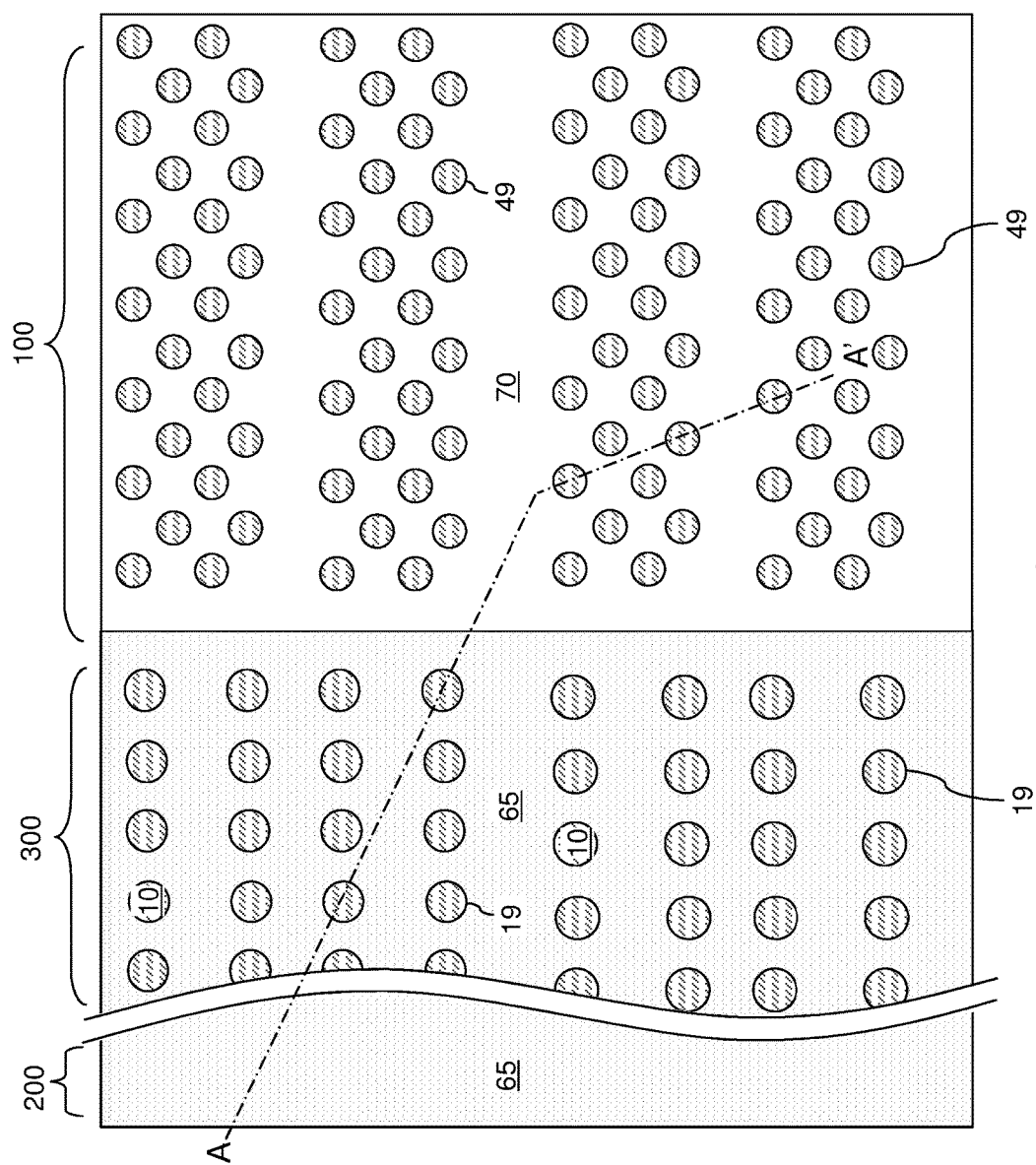
FIG. 5 is a top-down view of the exemplary structure of FIG. 4. The vertical plane A-A' is the plane of the cross-section for FIG. 4.

Referring to FIGS. 4 and 5, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, through the alternating stack (32, 42), the source select level silicon nitride layer 142, and the insulating base layer 132 by at least one anisotropic etch that employs the patterned lithographic material stack as an etch mask. Portions of the alternating stack (32, 42), the source select level silicon nitride layer 142, and the insulating base layer 132 that underlie the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70, the entirety of the alternating stack (32, 42), the source select level silicon nitride layer 142, and the insulating base layer 132 in the memory array region 100. The support openings 19 are formed through the retro-stepped dielectric material portion 65, the portion of the alternating stack (32, 42) that underlie the stepped surfaces, the source select level silicon nitride layer 142, and the insulating base layer 132 in the contact region 300.

The memory openings 49 extend through the entirety of the alternating stack (32, 42), the source select level silicon nitride layer 142, and the insulating base layer 132. The support openings 19 extend through a subset of layers within the alternating stack (32, 42), the source select level silicon nitride layer 142, and the insulating base layer 132. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. Each memory opening 49 has a substantially cylindrical initial volume, which is herein referred to as an initial memory opening volume. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Subsequently, at least one isotropic etch process is performed to laterally recess the source select level silicon nitride layer 142 selective to the materials of the sacrificial silicon nitride layers 42, the insulating layers 32, the insulating base layer 132, and the insulating cap layer 70. The at least one isotropic etch process can be a series of two isotropic etch processes, or preferably, a single isotropic etch process.

Figure 6:
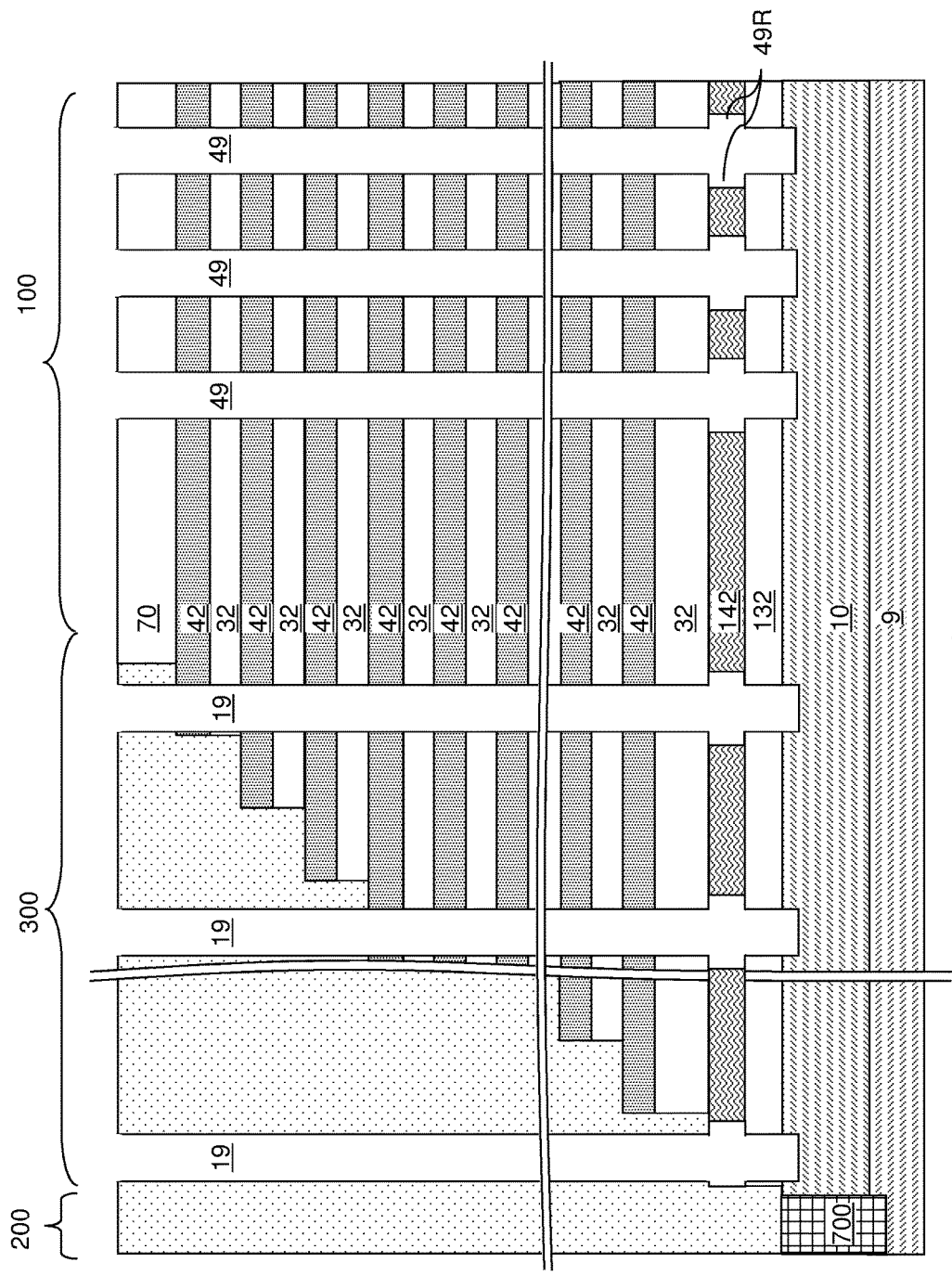
FIG. 6 is a schematic vertical cross-sectional view of the exemplary structure after laterally recessing sidewalls of the insulating layers within the alternating stack according to an embodiment of the present disclosure.

Referring to FIG. 6, an isotropic etch process can be performed, which etches the first silicon nitride material of the source select level silicon nitride layer 142 selective to the materials of the insulating layers 32, the second silicon nitride material of the sacrificial silicon nitride layers 42, the insulating base layer 132, and the insulating cap layer 70. The etch laterally recesses sidewalls of the source select level silicon nitride layer 142 and optionally the sacrificial silicon nitride layers 42 with differential etch rates according to an embodiment of the present disclosure. The ratio of the etch rate of the first silicon nitride material of the source select level silicon nitride layer 142 in the isotropic etch process to the etch rate of the second silicon nitride material of the sacrificial silicon nitride layers 42 in the isotropic etch process can be greater than 1.2. For example, the ratio of the etch rate of the first silicon nitride material of the source select level silicon nitride layer 142 in the isotropic etch process to the etch rate of the second silicon nitride material of the sacrificial silicon nitride layers 42 in the isotropic etch process may be in a range from 1.2 to 10, such as from 1.5 to 5, for example from 2.3 to 3.7. In one embodiment, the insulating layers 32, the insulating base layer 132, and the insulating cap layer 70 can include silicon oxide, and the isotropic etch process can be a dilute hydrofluoric etch process, i.e., a wet etch process employing dilute hydrofluoric acid.

The isotropic etch process etches the first silicon nitride material of the source select level silicon nitride layer 142 at a greater etch rate than the second silicon nitride material of the sacrificial silicon nitride layer 42. Thus, physically exposed sidewall of the source select level silicon nitride layer 142 are laterally recessed farther than physically exposed sidewalls of the sacrificial silicon nitride layers 42 by the isotropic etch process. In one embodiment, the isotropic etch process is a dilute hydrofluoric acid wet etch process, and the first silicon nitride material has a greater etch rate in dilute hydrofluoric acid than the second silicon nitride material. In one embodiment, the ratio of the lateral etch distance of the source select level silicon nitride layer 142 around each of the memory openings 49 and the support openings 19 to the lateral etch distance of the sacrificial silicon nitride layers 42 around each of the memory openings 49 and the support openings 19 can be in a range from 1.2 to 30, such as from 1.5 to 5.

In one embodiment, the dielectric materials of the insulating layers 32, the insulating base layer 132, and the insulating cap layer 70 can be collaterally etched during the isotropic etch process. In one embodiment, the etch rate for the dielectric materials of the insulating layers 32, the insulating base layer 132, and the insulating cap layer 70 in the dilute hydrofluoric acid can be about the same as the etch rate of the second silicon nitride material of the sacrificial silicon nitride layers 42. In this case, the recessed sidewalls of the insulating layers 32, the insulating base layer 132, and the insulating cap layer 70 are vertically coincident with sidewalls of the sacrificial silicon nitride layers 42. As used herein, a first surface and a second surface are "vertically coincident" if the first surface overlies or underlies the second surface and if there exists a vertical plane including the first surface and the second surface. However, the source select level silicon nitride layer 142 is recessed further from the central axis of the memory opening 49 than the sacrificial silicon nitride layers 42 to form a lateral recess 49R extending laterally from the memory opening 49 to the source select level silicon nitride layer 142.

FIGS. 7A-7H illustrate structural changes in a memory opening 49, which is one of the memory openings 49 in the exemplary structure of FIG. 6. The same structural change occurs simultaneously in each of the other memory openings 49 and in each support opening 19.

Referring to FIG. 7A, a memory opening 49 in the exemplary device structure of FIGS. 4A and 4B is illustrated. The memory opening 49 extends through the insulating cap layer 70, the alternating stack (32, 42), the source select level silicon nitride layer 142, and the insulating base layer 132, and optionally into an upper portion of the semiconductor material layer 10. At this processing step, the support openings 19 can extend through the retro-stepped dielectric material portion 65, a subset of layers in the alternating stack (32, 42), the source select level silicon nitride layer 142, and the insulating base layer 132, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. The sidewalls of the source select level silicon nitride layer 142 can be laterally recessed with respect to the sidewalls of the insulating layers 32, the sacrificial silicon nitride layers 42, and the insulating base layer 132 by a lateral recess distance lrd (i.e., the width of the lateral recesses 49R), which can be in a range from 3 nm to 30 nm, such as from 6 nm to 15 nm, for example 8 nm to 11 nm, although lesser and greater lateral recess distances can also be employed. A recessed top surface, and optionally sidewalls, of the semiconductor material layer 10 is physically exposed at the bottom of the memory opening 49 upon formation of the memory openings 49.

Referring to FIG. 7B, a pedestal channel portion 11 can be formed at the bottom portion of each memory opening 49 and each support openings 19 by a selective semiconductor deposition process. In one embodiment, the selective semiconductor deposition process may be a selective epitaxy process. If the semiconductor material layer 10 includes a single crystalline material, each pedestal channel portion 11 comprises a single crystalline semiconductor material in epitaxial alignment with the single crystalline semiconductor material of the semiconductor material layer 10. Alternatively, the semiconductor material layer 10 may be polycrystalline, and the pedestal channel portions 11 may be polycrystalline.

The pedestal channel portion 11 includes initial laterally annular protruding portions 11P that protrude into the lateral recesses 49R formed by the laterally recessed sidewalls of the source select level silicon nitride layer 142 around each memory opening 49. In one embodiment, the pedestal channel portion 11 can be doped with electrical dopants of the same conductivity type as the semiconductor material layer 10. Alternatively, if the semiconductor material layer 10 functions as buried source lines, the pedestal channel portion 11 can have a doping of the opposite conductivity type from the conductivity type of the semiconductor material layer 10. In one embodiment, the top surface of each pedestal channel portion 11 can be formed above a horizontal plane including the top surface of the source select level silicon nitride layer 142. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon or polycrystalline silicon. If a semiconductor material layer 10 is not present, the pedestal channel portion 11 can be formed directly on the substrate semiconductor layer 9, which can have a doping of the first conductivity type.

Referring to FIG. 7C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial silicon nitride layers 42 and the insulating layers 32 can have vertically coincident sidewalls, and the charge storage layer 54 can be formed as a single continuous layer.

In another embodiment, the sacrificial silicon nitride layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 7D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial silicon nitride layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 7E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 7F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 7G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 7H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11, a memory stack structure 55, a dielectric core 62, and a drain region 63 within a memory opening 49 is herein referred to as a memory opening fill structure (11, 55, 62, 63). Each combination of a pedestal channel portion 11, a memory film 50, a vertical semiconductor channel 60, a dielectric core 62, and a drain region 63 within each support opening 19 fills a respective support opening 19, and constitutes a support pillar structure. The support pillar structures are formed through the stepped surfaces and through the retro-stepped dielectric material portion 65 concurrently with formation of the memory opening fill structures (11, 55, 62, 63) that include the memory stack structures 55.

The maximum lateral extent of the epitaxial channel portion 11 at the initial laterally protruding annular portions 11P occurs at the level of the source select level silicon nitride layer 142. As used herein, a "maximum lateral extent" or a "maximum lateral dimension" is the maximum of all measurable lateral extents or the maximum of all measurable lateral dimensions. In one embodiment, the maximum lateral extent (e.g., thickness) for an epitaxial channel portion 11 at portions 11P can be greater than the maximum lateral dimension (e.g., diameter) of the memory film 50 by a dimension in a range from 6 nm to 60 nm, such as from 12 nm to 30 nm, for example 16 nm to 22 nm, although lesser and greater differences in the maximum lateral extent can also be employed.

Figure 8:
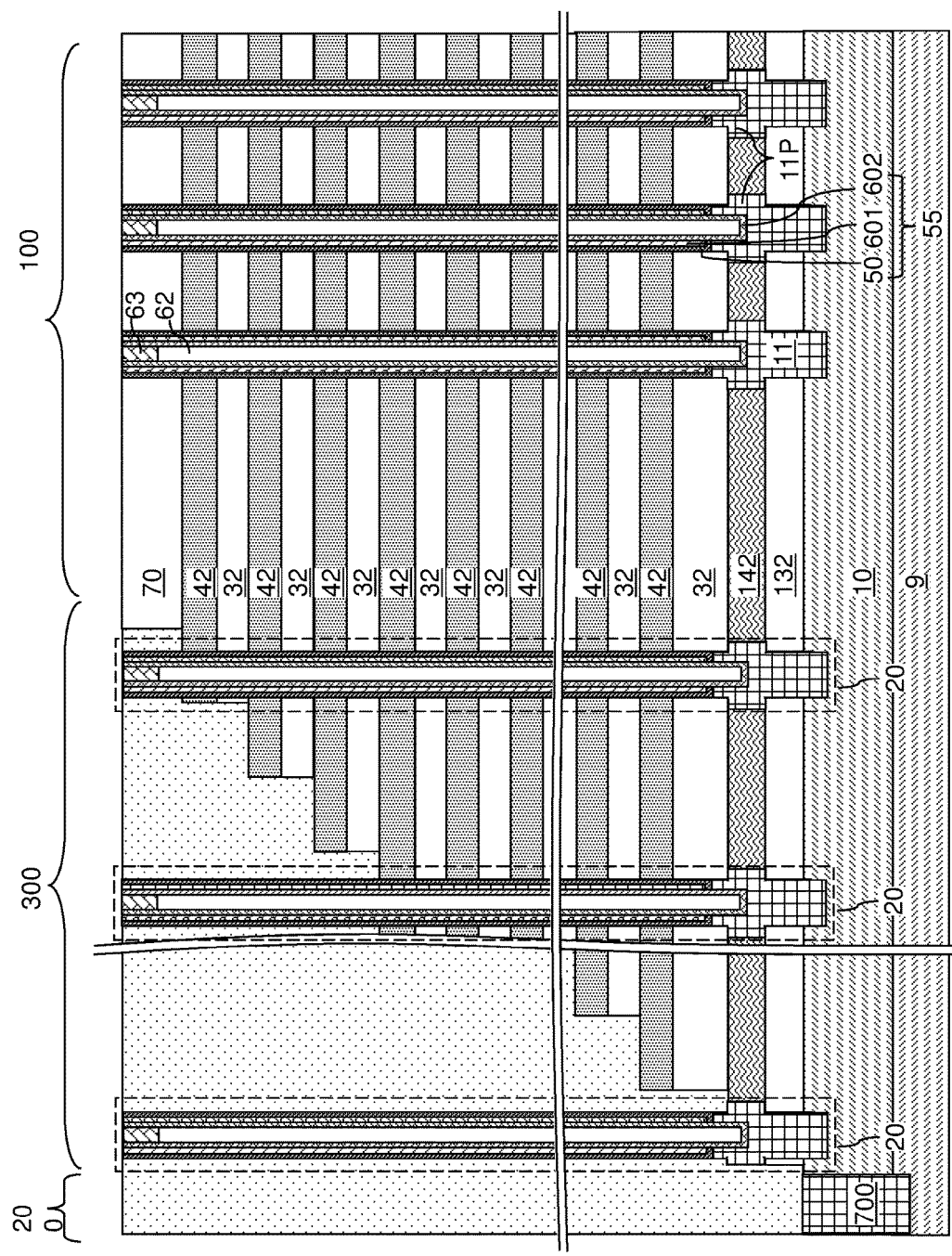
FIG. 8 is a schematic vertical cross-sectional view of the exemplary structure after formation of memory stack structures and support pillar structures according to an embodiment of the present disclosure.

Referring to FIG. 8, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIG. 6. An instance of the support pillar structure 20 can be formed within each support opening 19 of the structure of FIG. 6.

Figure 9A:
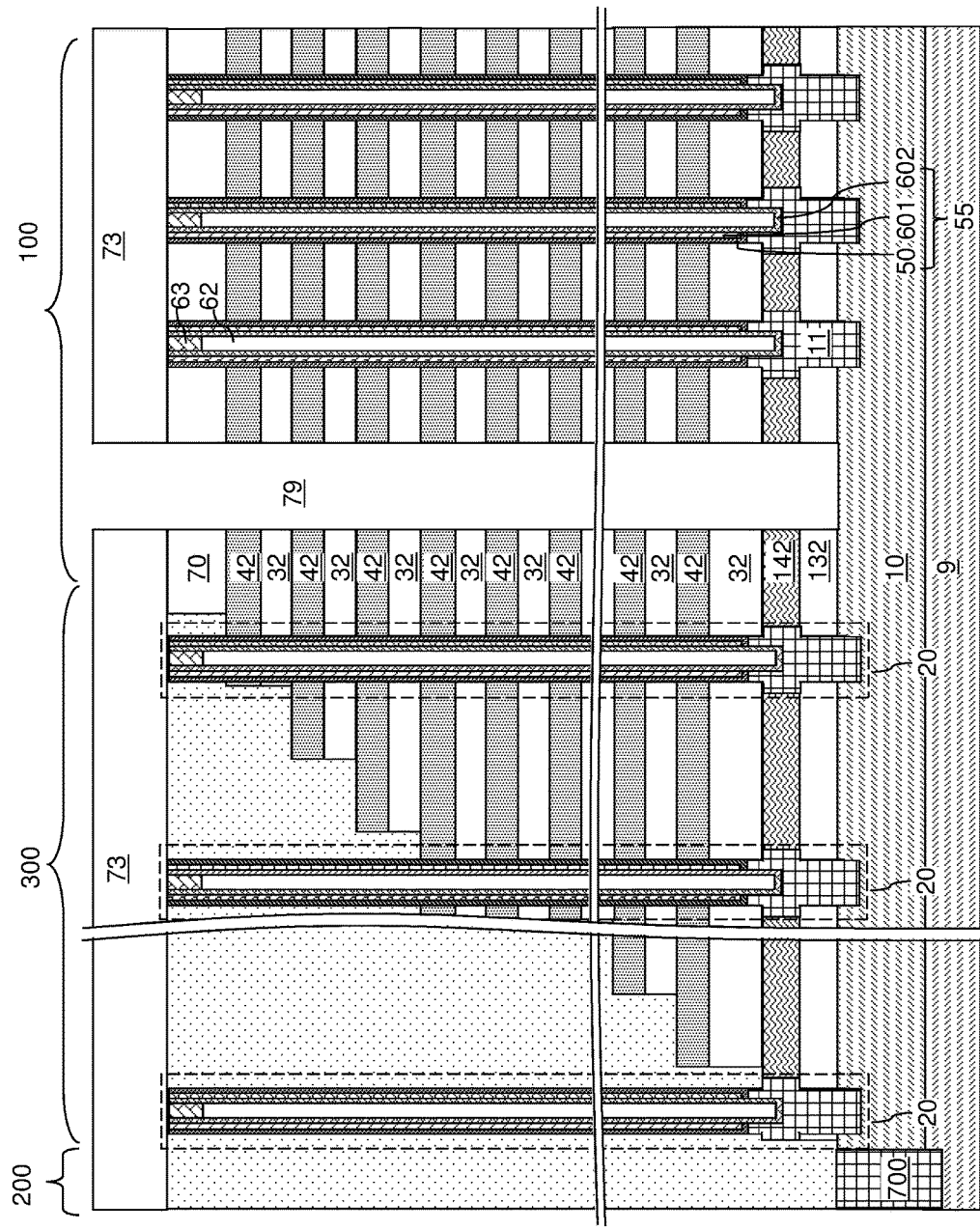
FIG. 9A is a schematic vertical cross-sectional view of the exemplary structure after formation of backside trenches according to an embodiment of the present disclosure.
Figure 9B:
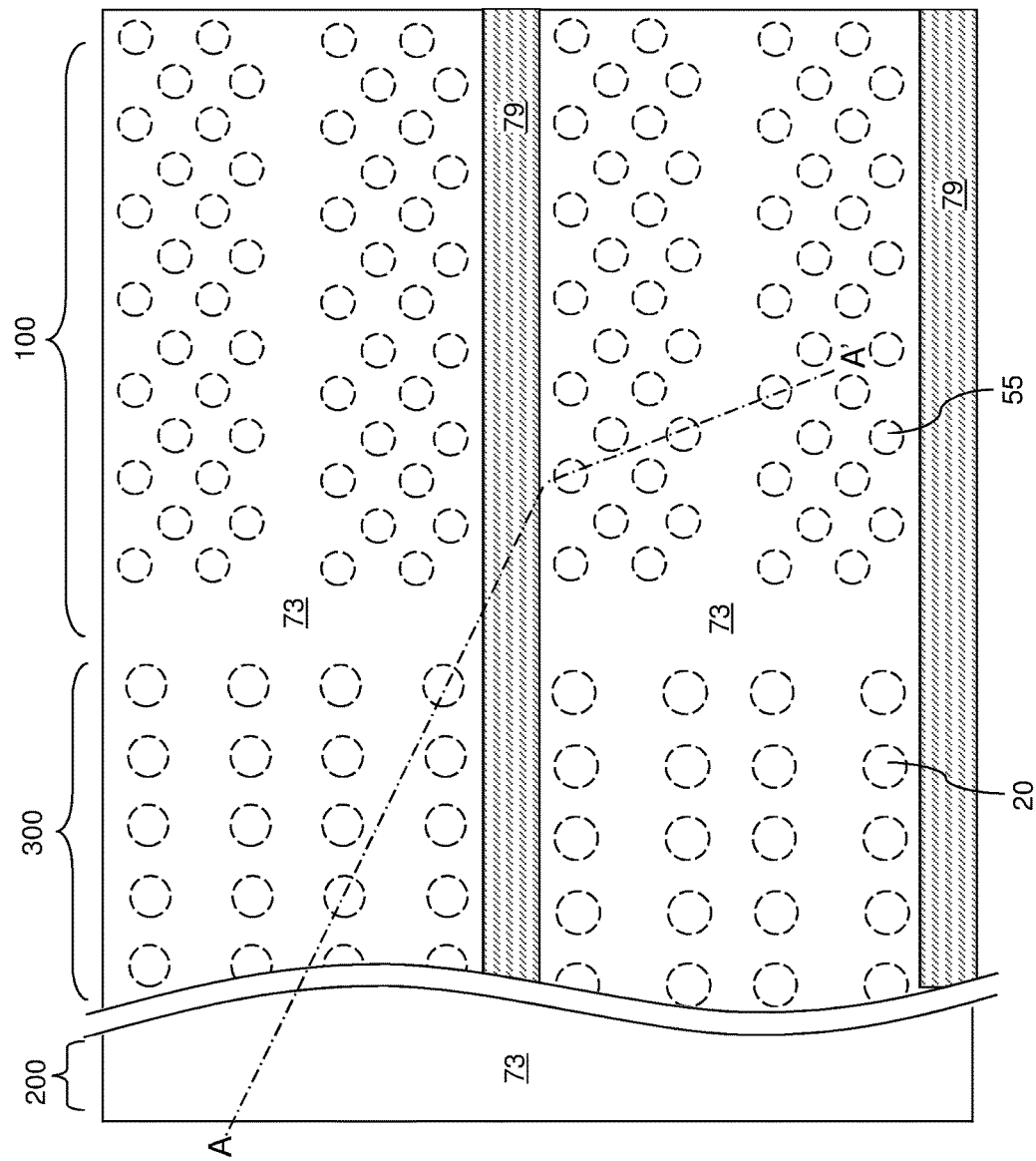
FIG. 9B is a partial see-through top-down view of the exemplary structure of FIG. 9A. The vertical plane A-A' is the plane of the schematic vertical cross-sectional view of FIG. 9A.

Referring to FIGS. 9A and 9B, a contact level dielectric layer 73 can be formed over the alternating stack (32, 42) of insulating layers 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the insulating cap layer 70, the alternating stack (32, 42), the source select level silicon nitride layer 142, and the insulating base layer 132 and/or the retro-stepped dielectric material portion 65 employing an anisotropic etch to form backside trenches 79. The backside trenches 79 vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 10:
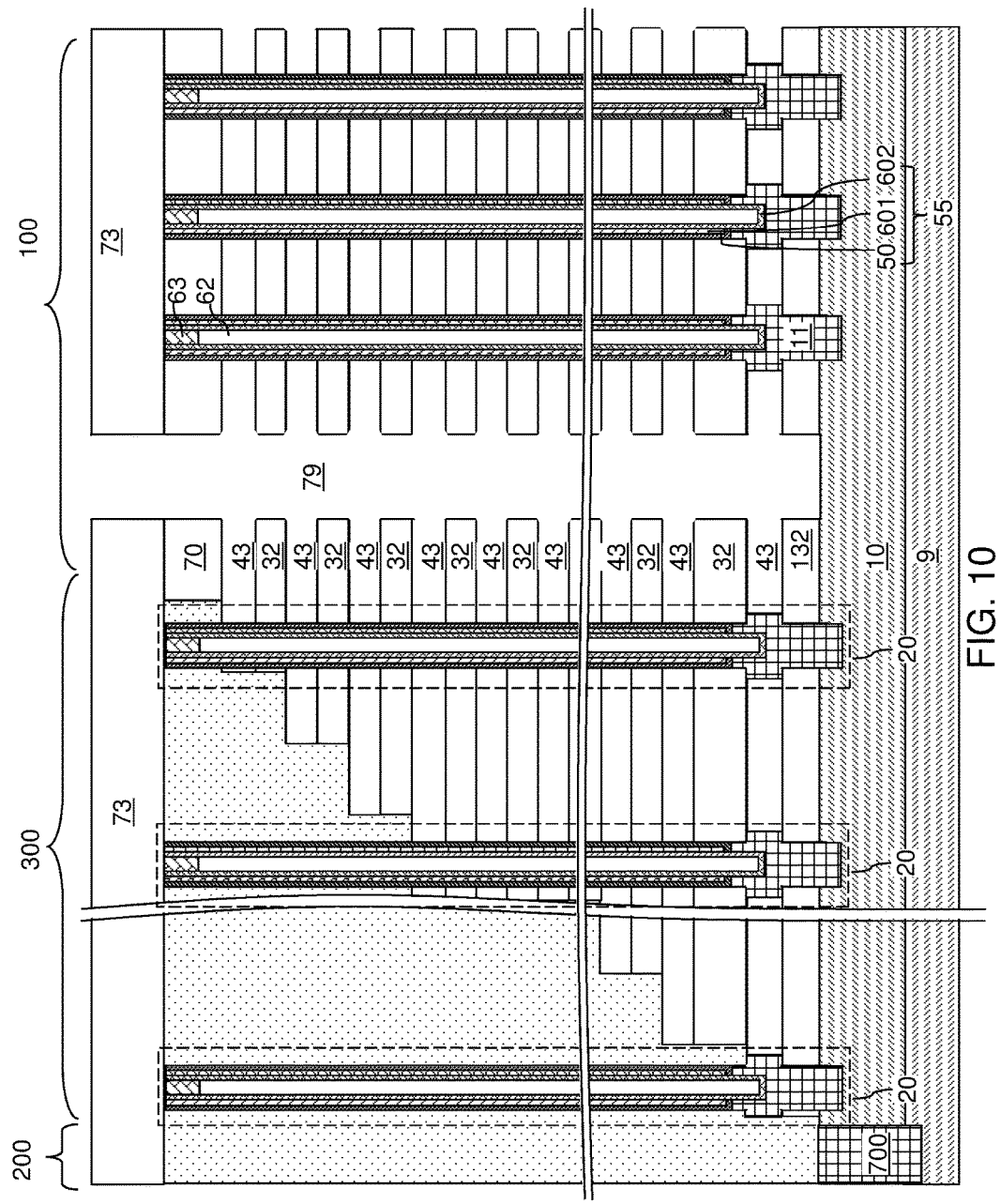
FIG. 10 is a schematic vertical cross-sectional view of the exemplary structure after formation of backside recesses according to an embodiment of the present disclosure.

Referring to FIG. 10, an isotropic etch process is performed, in which an etchant that selectively etches the first and second silicon nitride materials of the source select level silicon nitride layer 142 and the sacrificial silicon nitride layers 42 with respect to the materials of the insulating layers 32, the insulating cap layer 70, the insulating base layer 132, the contact level dielectric layer 73, and the retro-stepped dielectric material portion 65 and the semiconductor materials of the semiconductor material layer 10 and the pedestal channel portions 11 is introduced into the backside trenches 79. Backside recesses 43 are formed in volumes from which the sacrificial silicon nitride layers 42 and the source select level silicon nitride layer 142 are removed. The removal of the first and second silicon nitride materials of the source select level silicon nitride layer 142 and the sacrificial silicon nitride layers 42 can be selective to the outermost layer of the memory films 50. In one embodiment, the insulating layers 32, the insulating cap layer 70, the insulating base layer 132, the contact level dielectric layer 73, and the retro-stepped dielectric material portion 65 can include silicon oxide materials, and the isotropic etch process can be a hot phosphoric acid wet etch process, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42 and the source select level silicon nitride layer 142.

Each backside recess 43 can be a laterally extending cavity having a lateral dimension that is greater than the vertical extent of the cavity. In other words, the lateral dimension of each backside recess 43 can be greater than the height of the backside recess 43. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 11:
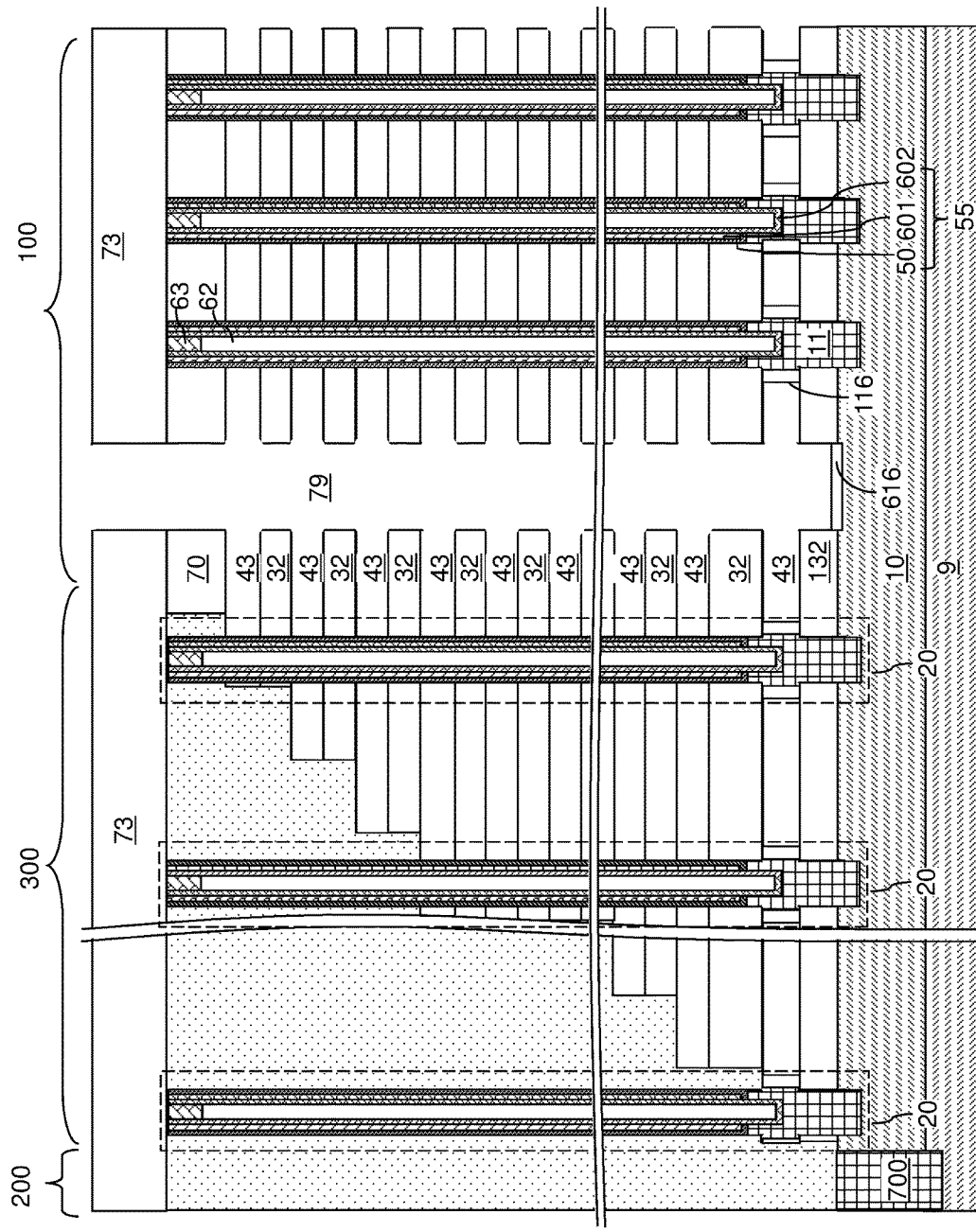
FIG. 11 is a schematic vertical cross-sectional view of the exemplary structure after formation of tubular dielectric spacers according to an embodiment of the present disclosure.

Referring to FIGS. 11 and 12A, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be formed by converting a cylindrical surface portion (e.g., portion 11P) of a pedestal channel portion 11 into a semiconductor oxide portion (e.g., silicon oxide) by an oxidation process. The thickness of the tubular dielectric spacers 116 (as defined by the minimum distance between the vertical outer sidewall and the vertical inner sidewall) can be in a range from 2 nm to 30 nm, such as from 4 nm to 20 nm, for example from 12 nm to 16 nm, although lesser and greater thicknesses can also be employed.

In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Each pedestal channel portion 11 can optionally include a laterally protruding annular portion 11A that laterally protrudes farther outward than sidewalls of the insulating layers 32 at a periphery of a respective memory opening 49, i.e., from the vertical plane including the interface between the insulating layers 32 and the memory film 50 within the memory opening 49. The lateral offset distance LOD between the sidewall of the laterally protruding annular portion 11A and a vertical plane including the interface between the insulating layers 32 and the memory film 50 can be in a range from 1 nm to 10 nm, such as from 3 nm to 5 nm, although lesser and greater lateral offset distances can also be employed.

In the embodiment of FIGS. 12A-12D, each pedestal channel portion 11 includes a main portion 11M and the laterally protruding annular portion 11A which comprise a unitary single crystal silicon portion such that there is no boundary (e.g., no grain boundary) between them. Alternatively, the oxidation can convert the entire initial laterally protruding annular portions 11P into semiconductor oxide (e.g., silicon oxide) tubular dielectric spacers 116 such that the laterally protruding portions 11A are omitted, as described below with respect to FIG. 12E.

Referring to FIG. 12B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32, outer sidewalls of the tubular dielectric spacers 116, and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 12C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 13:
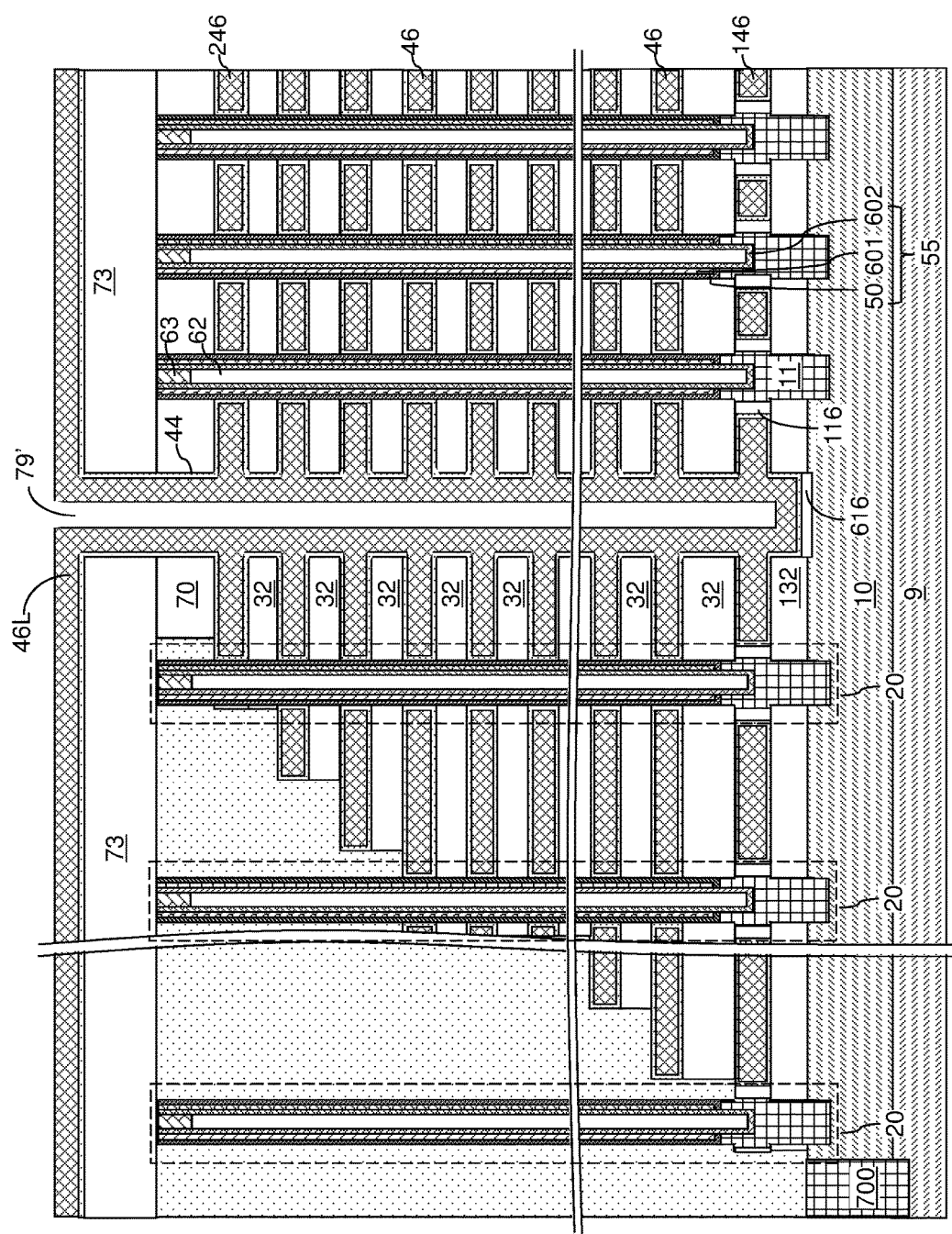
FIG. 13 is a schematic vertical cross-sectional view of the exemplary structure at the processing steps of FIG. 12D.

Referring to FIGS. 12D and 13, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers (46, 146) can be formed in the plurality of backside recesses 43, and a continuous metallic material layer 46L can be formed on the sidewalls of each backside trench 79 and over the contact level dielectric layer 73. The plurality of electrically conductive layers (46, 146) include a source select level electrically conductive layer 146 and word line electrically conductive layers 46. The electrically conductive layers may also include one or more drain select level electrically conductive layers 246 at the top of the alternating stack. The source select level electrically conductive layer 146 is formed in the volume from which the source select level silicon nitride layer 142 is removed. The word line electrically conductive layers 46 and the drain select level electrically conductive layers 246 are formed in the volumes from which the sacrificial nitride layers 42 are removed. Thus, each sacrificial silicon nitride layer 42 can be replaced with a respective word line electrically conductive layer 46.

Each electrically conductive layer (46, 146) includes a portion of the metallic barrier layer 46A and a portion of the metallic fill material layer 46B that are located between a vertically neighboring pair of dielectric material layers, which can be a pair of insulating layers 32, a base insulating layer 132, or a topmost insulating layer and the insulating cap layer 70. The continuous metallic material layer 46L includes a continuous portion of the metallic barrier layer 46A and a continuous portion of the metallic fill material layer 46B that are located in the backside trenches 79 or above the contact level dielectric layer 73.

A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. The source select level electrically conductive layer 146 laterally surrounds each tubular dielectric spacer 116.

Referring to FIGS. 12E and 12F, alternative embodiments of the exemplary structure are illustrated, which is derived from the exemplary structure described above by alternating the thickness of the tubular dielectric spacers 116. In one embodiment, the thickness of the tubular dielectric spacers 116 can be adjusted such that the inner vertical sidewall of a tubular dielectric spacer 116 can be vertically coincident with a vertical interface between the insulating layers 32 and a memory film 50 as illustrated in FIG. 12E. In another embodiment, the thickness of the tubular dielectric spacers 116 can be adjusted such that the inner vertical sidewall of a tubular dielectric spacer 116 can be located inside a vertical interface between the insulating layers 32 and a memory film 50 as illustrated in FIG. 12F. In other words, the inner vertical sidewall of the tubular dielectric spacer 116 can be more proximal to a vertical axis passing through the geometrical center of the volume of the memory opening fill structure (11, 55, 62, 63) that contacts the tubular dielectric spacer 116 than the vertical interface between the insulating layers 32 and the memory film 50 of the memory opening fill structure (11, 55, 62, 63) is to the geometrical center.

Figure 14:
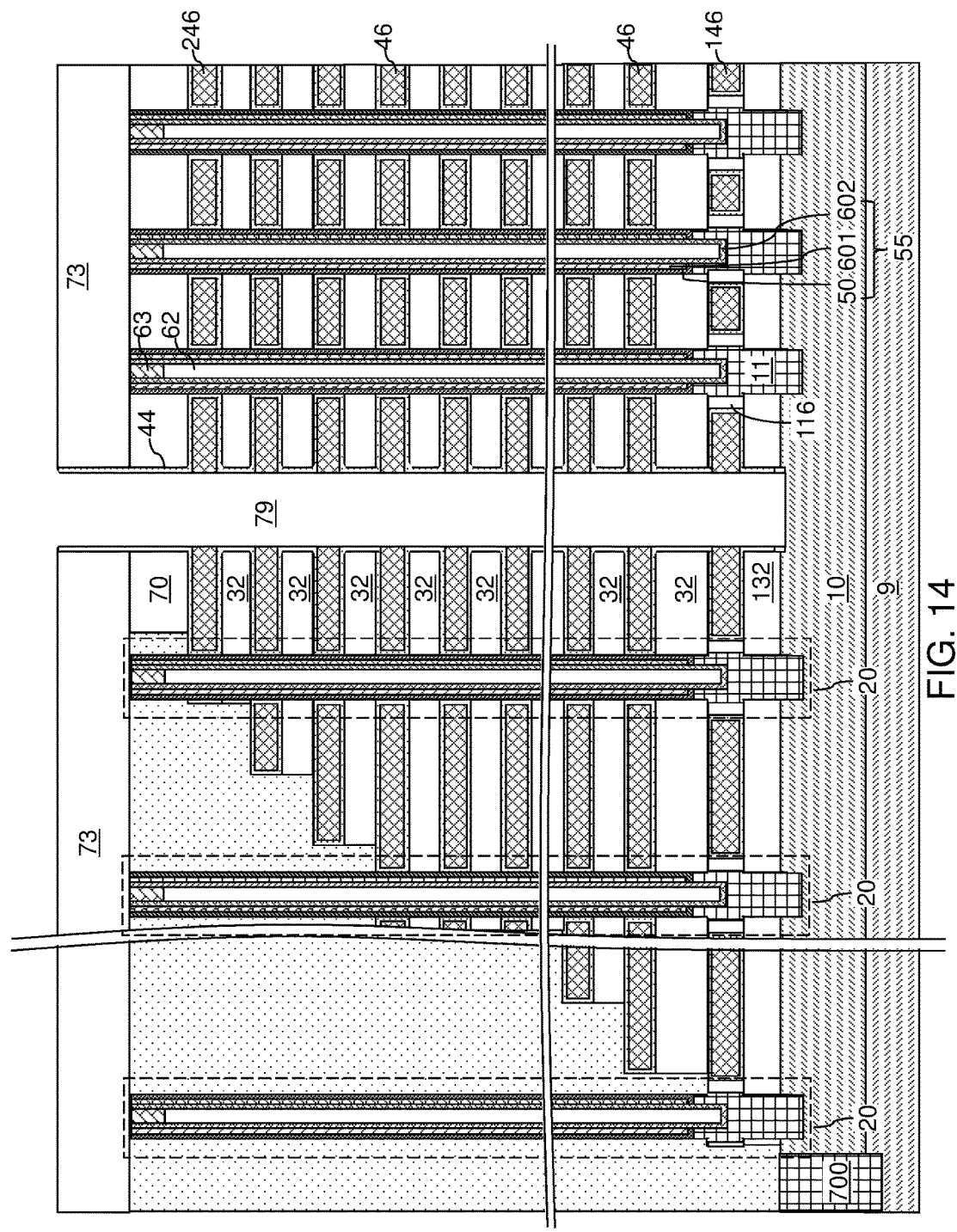
FIG. 14 is a schematic vertical cross-sectional view of the exemplary structure after removal of a deposited conductive material from within the backside trench according to an embodiment of the present disclosure.

Referring to FIG. 14, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer (46, 146). Each electrically conductive layer (46, 146) can be a conductive line structure. Each word line electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each word line electrically conductive layer 46 are the control gate electrodes for the vertical memory devices including the memory stack structures 55. In other words, each word line electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 15A:
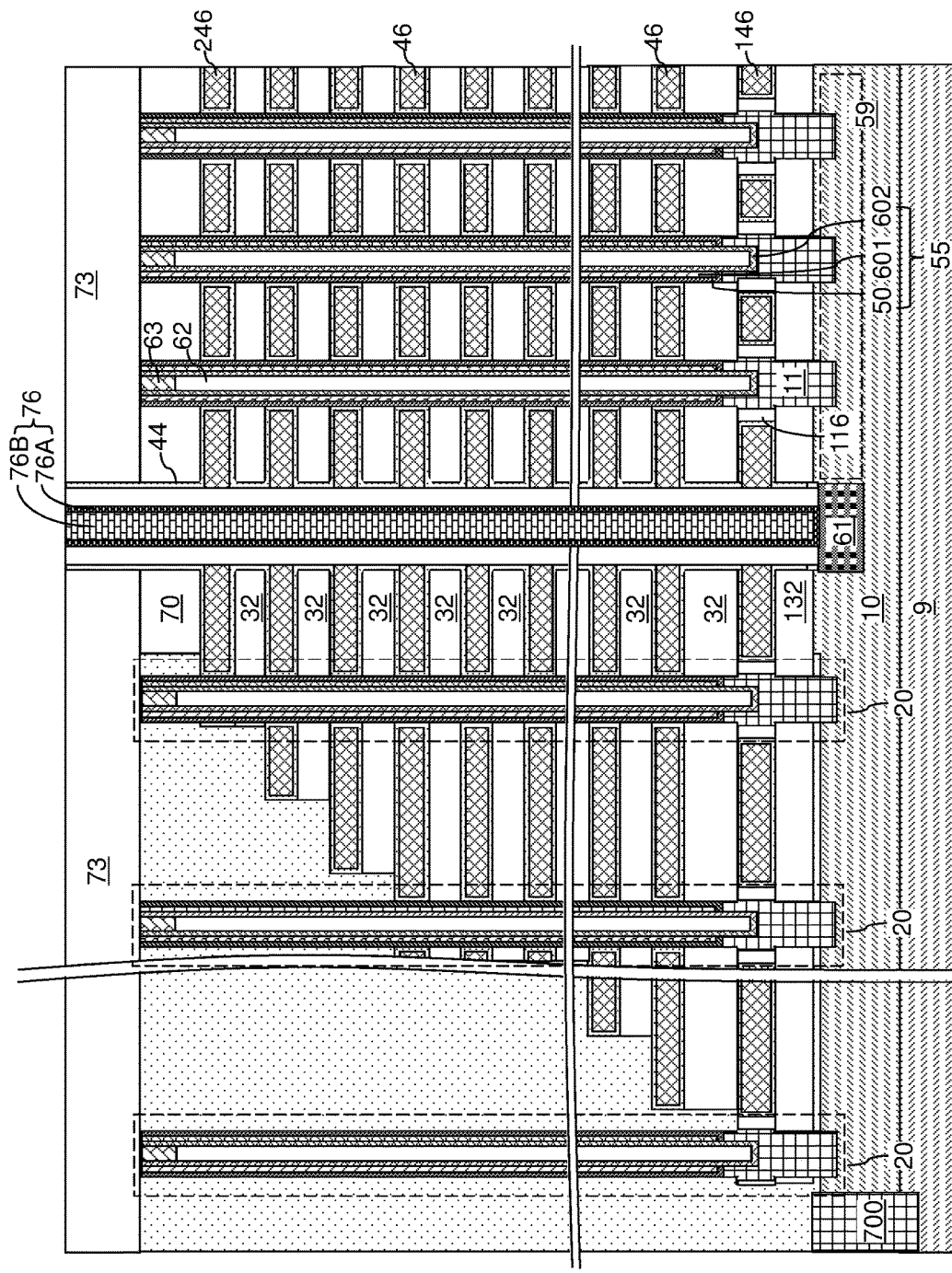
FIG. 15A is a schematic vertical cross-sectional view of the exemplary structure after formation of insulating spacers and backside contact structures according to an embodiment of the present disclosure.
Figure 15B:
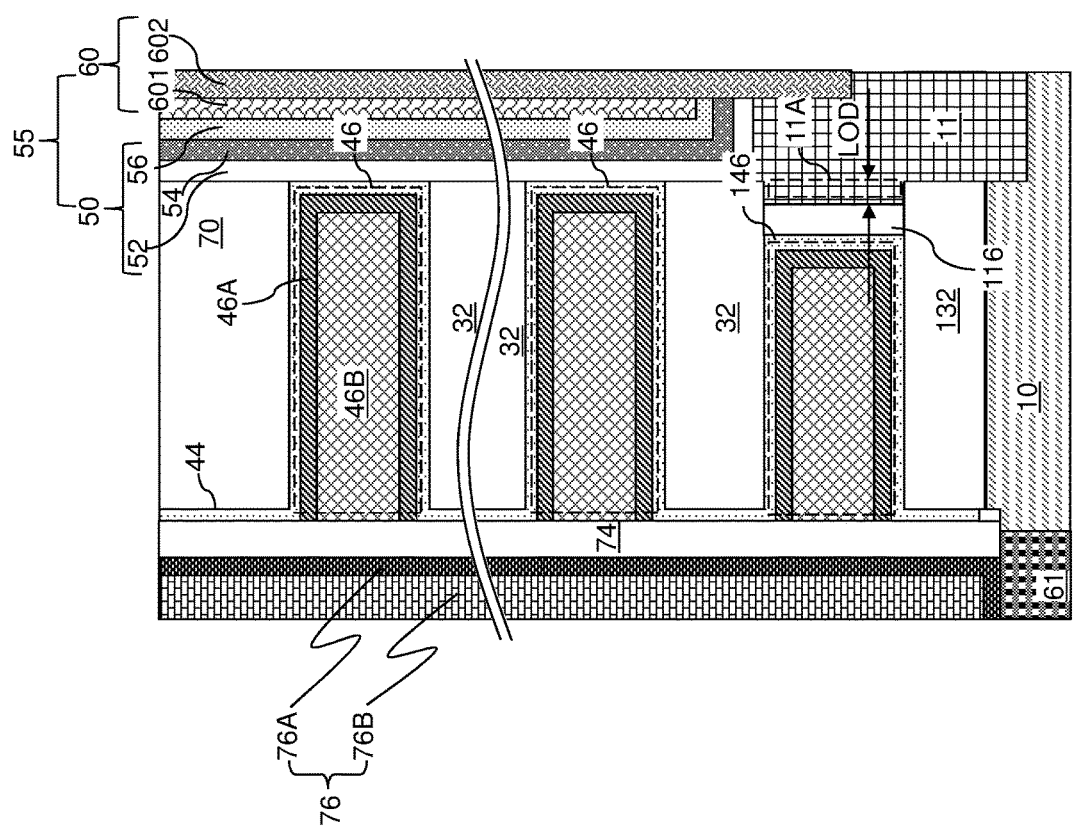
FIG. 15B is a schematic vertical cross-sectional view of a region of the exemplary structure of FIG. 15A.

Referring to FIGS. 15A and 15B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors (i.e., vertical NAND strings). The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. The source select level electrically conductive layer 146 can comprise a select gate electrode for the field effect transistors (i.e., vertical NAND strings). Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 16A:
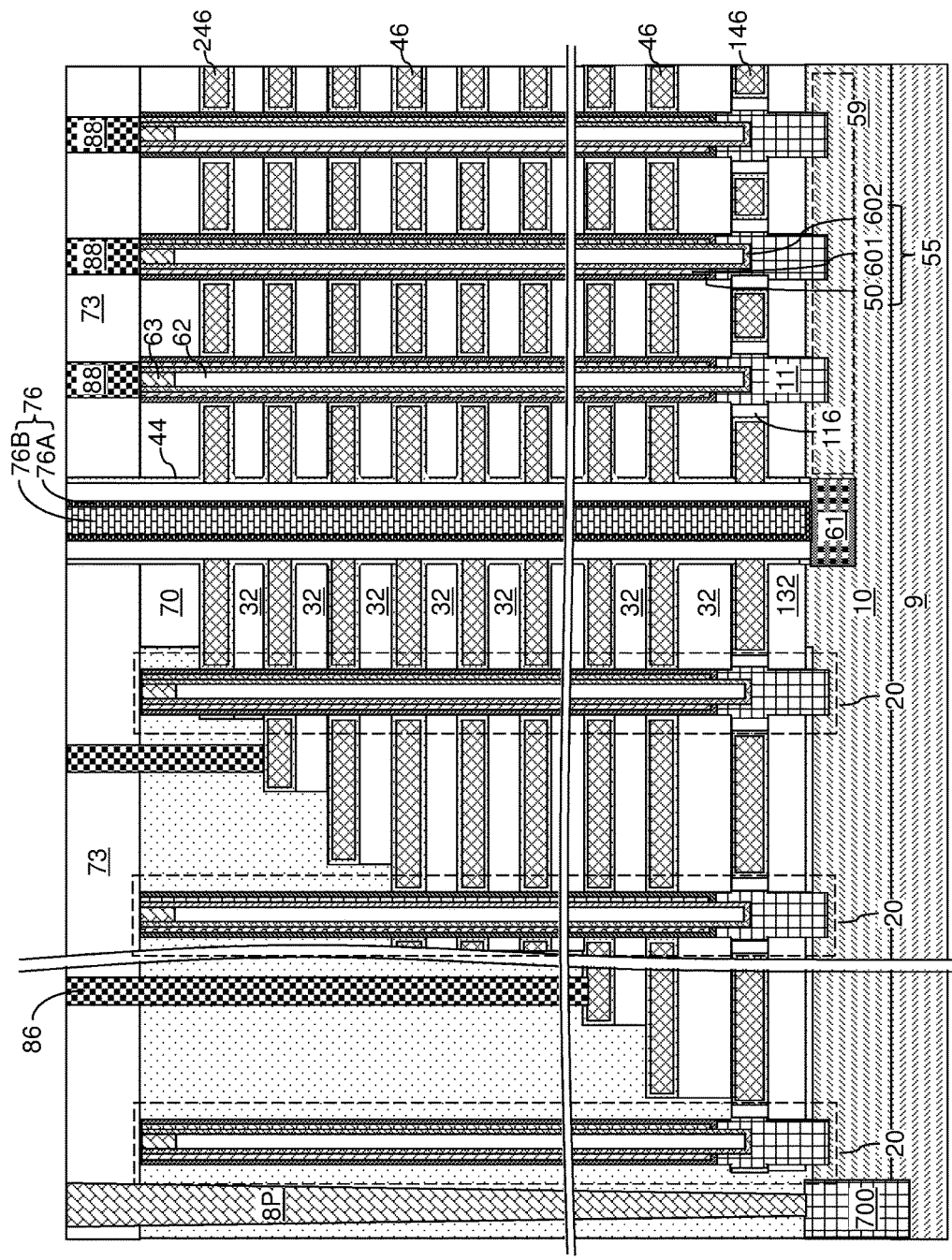
FIG. 16A is a schematic vertical cross-sectional view of the exemplary structure after formation of additional contact via structures according to an embodiment of the present disclosure.
Figure 16B:
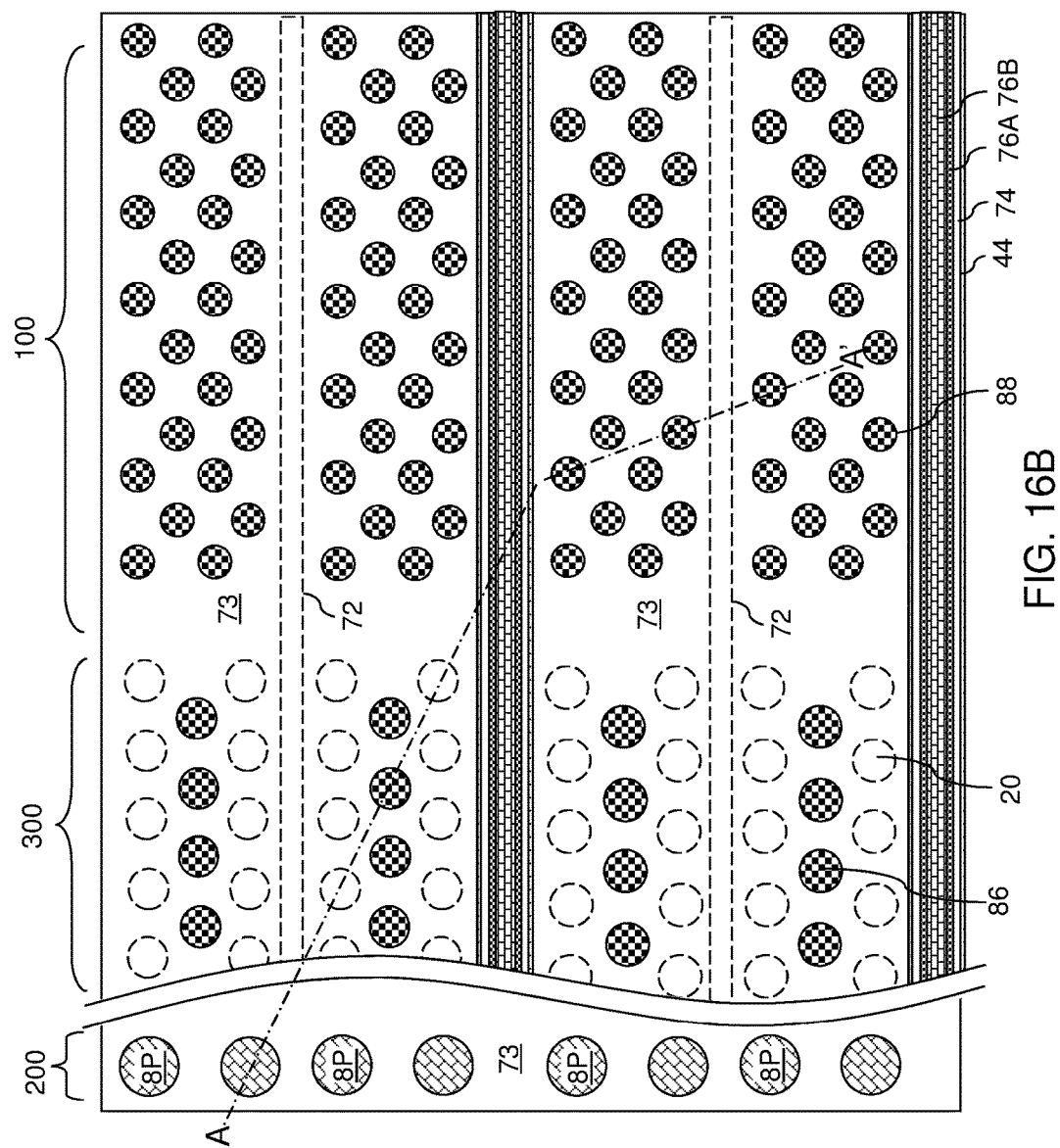
FIG. 16B is a top-down view of the exemplary structure of FIG. 16A. The vertical plane A-A' is the plane of the schematic vertical cross-sectional view of FIG. 16A.

Referring to FIGS. 16A and 16B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring generally to all the figures of the present disclosure, embodiments of the present disclosure provide a three-dimensional memory device, which comprises: a source select level electrically conductive layer 146 located over a substrate (9, 10); an alternating stack of insulating layers 32 and word line electrically conductive layers 46 located over the source select level electrically conductive layer 146; a memory opening 49 extending through the alternating stack (32, 46) and the source select level electrically conductive layer 146, wherein sidewalls of the memory opening 49 include sidewalls of the insulating layers 32; a pedestal channel portion 11 located at a bottom region of the memory opening 49 comprising a semiconductor material and contacting a top surface of a horizontal semiconductor channel 59 located over or in the substrate (9, 10), wherein the pedestal channel portion comprises a main portion 11M and a unitary laterally protruding annular portion 11A that laterally protrudes farther outward than the sidewalls of the insulating layers 32; and a memory stack structure 55 located in the memory opening 49 and contacting a top surface of the pedestal channel portion 11, wherein the memory stack structure 55 comprises a memory film 50 and a vertical semiconductor channel 60 located inside the memory film 50.

In one embodiment, the three-dimensional memory device can further comprise a tubular dielectric spacer 116 contacting, and laterally surrounding, the pedestal channel portion, 11 and laterally surrounded by the source select level electrically conductive layer 146. In one embodiment, the tubular dielectric spacer 116 comprises an outer sidewall and an inner sidewall; and the inner sidewall of the tubular dielectric spacer 116 contacts a sidewall of the laterally protruding annular portion 11A. In one embodiment, an entire interface between the tubular dielectric spacer 116 and the laterally protruding annular portion 11A is laterally offset from a cylindrical vertical plane including a sidewall of the memory opening 49 (which also includes the vertical interfaces between the insulating layers 32 and the memory film 50) by a uniform lateral offset distance LOD. In one embodiment, the tubular dielectric spacer 116 comprises an oxide of a semiconductor material of the pedestal channel portion 11.

In one embodiment, the pedestal channel portion 11 has a maximum lateral extent at a height of the laterally protruding annular portion 11A. In one embodiment, an outer sidewall of the memory film 50 extends vertically through each layer within the alternating stack (32, 46), e.g., from the bottommost layer of the alternating stack (32, 46) to the topmost layer of the alternating stack (32, 46) as a set of continuous material layers (52, 54, 56).

In one embodiment, the three-dimensional memory device further comprises an insulating base layer 132 located between the source select level electrically conductive layer 146 and the substrate (9, 10) and contacting a sidewall of the pedestal channel portion 11, wherein a bottom surface of the laterally protruding annular portion 11A contacts a top surface of the insulating base layer 132. In one embodiment, the laterally protruding annular portion 11A comprises an annular top surface, an annular bottom surface, a cylindrical inner sidewall surface, and a cylindrical outer sidewall surface. In the embodiment of FIGS. 12A-12D, each pedestal channel portion 11 includes a main portion 11M and the laterally protruding annular portion 11A which comprise a unitary single crystal silicon portion such that there is no boundary (e.g., no grain boundary) between them.

In one embodiment, the alternating stack (32, 46) comprises a terrace region in which each word line electrically conductive layer 46 other than a topmost word line electrically conductive layer 46 within the alternating stack (32, 46) laterally extends farther than an overlying word line electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). Support pillar structures 20 extend through the stepped surfaces and through a retro-stepped dielectric material portion 65 that overlies the stepped surfaces.

In one embodiment, the three-dimensional memory device further comprises a backside blocking dielectric layer 44 disposed between each neighboring pair of a word line electrically conductive layer 46 and an insulating layer 32 and extending from a bottommost layer within the alternating stack (32, 46) to a topmost layer within the alternating stack (32, 46), wherein the pedestal channel portion 11 is laterally spaced from the backside blocking dielectric layer 44 by the tubular dielectric spacer 116.

The exemplary structure can include a three-dimensional memory device. In one embodiment, the three-dimensional memory device comprises a vertical NAND memory device. The word line electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of a word line electrically conductive layer 46) in a first device level of the array of monolithic three-dimensional NAND strings can be located over another memory cell (as embodied as another portion of the charge storage layer 54 at a level of another word line electrically conductive layer 46) in a second device level of the array of monolithic three-dimensional NAND strings. The silicon substrate can contain an integrated circuit comprising a driver circuit for the memory device located thereon. The word line electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Cracking or breakage of the pedestal channel portion 11 at the level of the source select level electrically conductive layer 146 can be reduced or eliminated by structurally reinforcing the pedestal channel portion 11 (e.g., by making it wider and/or avoiding over-narrowing it by oxidation).

The structural reinforcement can be provided by forming the annular oxide spacer 116 in the backside recesses 43 after formation of the pedestal channel portion 11. The lateral recessing of the source select level silicon nitride layer 142 selective to the sacrificial silicon nitride layer 42 provides the lateral recesses 49R which are filled with the initial laterally protruding annular portions 11P of the pedestal channel portion 11 at the time of formation. Even after formation of the tubular dielectric spacers 116, the pedestal channel portions 11 can have the same lateral dimension (i.e., thickness) as, or can have a greater lateral dimension than, the overlying memory film 50 and the memory stack structure 55, thereby reducing or preventing cracking or breakage during subsequent processing steps, such as the processing steps employed to form the backside contact via structure 76 in the backside trench 79.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming a source select level silicon nitride layer including a first silicon nitride material over a substrate;
   forming an alternating stack of insulating layers and sacrificial silicon nitride layers including a second silicon nitride material over the source select level silicon nitride layer;
   forming a memory opening through the alternating stack and the source select level silicon nitride layer;
   laterally recessing a sidewall of the source select level silicon nitride layer farther than sidewalls of the sacrificial silicon nitride layers employing an isotropic etch process that etches the first silicon nitride material at a greater etch rate than the second silicon nitride material;
   forming a pedestal channel portion at a bottom region of the memory opening, wherein the pedestal channel portion contacts a remaining portion of the source select level silicon nitride layer;
   forming a memory stack structure on the pedestal channel portion in the memory opening, wherein the memory stack structure comprises a memory film and a vertical semiconductor channel located inside the memory film;
   forming a tubular dielectric spacer by converting a cylindrical surface portion of the pedestal channel portion into a semiconductor oxide portion by an oxidation process; and
   replacing the source select level silicon nitride layer and the sacrificial silicon nitride layers with a source select level electrically conductive layer and word line electrically conductive layers, respectively.

2. The method of claim 1, further comprising:
   forming a backside trench through the alternating stack and the source select level sacrificial material layer; and
   forming backside recesses by etching the source select level silicon nitride layer and the sacrificial silicon nitride layers selective to the pedestal channel portion and the memory film,
   wherein the tubular dielectric spacer is formed after formation of the backside recesses and prior to formation of the source select level electrically conductive layer and the word line electrically conductive layers.

3. The method of claim 1, wherein:
   the source select level silicon nitride layer is recessed further from a central axis of the memory opening than the sacrificial silicon nitride layers to form a lateral recess extending laterally from the memory opening to the source select level silicon nitride layer;
   forming the pedestal channel portion comprises growing the pedestal channel portion in the memory opening such that an initial laterally protruding annular portion of the pedestal channel portion is grown in the lateral recess during the step of growing the pedestal channel portion and such that the initial laterally protruding annular portion contacts the remaining portion of the source select level silicon nitride layer in the lateral recess; and
   the pedestal channel portion comprises a laterally protruding annular portion that laterally protrudes farther outward than sidewalls of the insulating layers at a periphery of the memory opening after formation of the tubular dielectric spacer.

4. The method of claim 1, wherein:
   the second silicon nitride material differs in at least one of structure or composition from the first silicon nitride material;
   the first silicon nitride material has a greater etch rate in hydrofluoric acid than the second silicon nitride material; and
   the isotropic etch process is a hydrofluoric acid wet etch process.

5. The method of claim 4, wherein the sacrificial silicon nitride layers are formed by a deposition process selected from a plasma enhanced chemical vapor deposition process and a low pressure chemical vapor deposition process.

6. The method of claim 4, wherein:
   the source select level silicon nitride layer is formed by a first plasma enhanced chemical vapor deposition process; and
   the sacrificial silicon nitride layers are formed by a deposition process selected from a low pressure chemical vapor deposition process and a second plasma enhanced chemical vapor deposition process that provides a higher deposition rate than the first plasma enhanced chemical vapor deposition process.

7. The method of claim 1, wherein a ratio of an etch rate of the first silicon nitride material in the isotropic etch process to an etch rate of the second silicon nitride material in the isotropic etch process is greater than 1.5.

8. The method of claim 1, wherein the source select level silicon nitride layer is recessed further from a central axis of the memory opening than the sacrificial silicon nitride layers to form a lateral recess extending laterally from the memory opening to the source select level silicon nitride layer.

9. The method of claim 1, wherein:
   the three-dimensional memory device comprises a monolithic three-dimensional NAND memory device;
   the word line electrically conductive layers comprise, or are electrically connected to, a respective word line of the monolithic three-dimensional NAND memory device;
   the substrate comprises a silicon substrate;
   the monolithic three-dimensional NAND memory device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the word line electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

10. A method of forming a three-dimensional memory device, comprising:

forming a source select level silicon nitride layer including a first silicon nitride material over a substrate;

forming an alternating stack of insulating layers and sacrificial silicon nitride layers including a second silicon nitride material over the source select level silicon nitride layer;

forming a memory opening through the alternating stack and the source select level silicon nitride layer;

laterally recessing a sidewall of the source select level silicon nitride layer farther than sidewalls of the sacrificial silicon nitride layers employing an isotropic etch process that etches the first silicon nitride material at a greater etch rate than the second silicon nitride material;

forming a pedestal channel portion at a bottom region of the memory opening, wherein the pedestal channel portion contacts a remaining portion of the source select level silicon nitride layer;

forming a memory stack structure on the pedestal channel portion in the memory opening, wherein the memory stack structure comprises a memory film and a vertical semiconductor channel located inside the memory film; and replacing the source select level silicon nitride layer and the sacrificial silicon nitride layers with a source select level electrically conductive layer and word line electrically conductive layers, respectively;

wherein:

the second silicon nitride material differs in at least one of structure or composition from the first silicon nitride material;

the first silicon nitride material has a greater etch rate in hydrofluoric acid than the second silicon nitride material;

the isotropic etch process is a hydrofluoric acid wet etch process;

the source select level silicon nitride layer is formed by a first plasma enhanced chemical vapor deposition process; and the sacrificial silicon nitride layers are formed by a deposition process selected from a low pressure chemical vapor deposition process and a second plasma enhanced chemical vapor deposition process that provides a higher deposition rate than the first plasma enhanced chemical vapor deposition process.

11. A method of forming a three-dimensional memory device, comprising:

forming a source select level silicon nitride layer including a first silicon nitride material over a substrate;

forming an alternating stack of insulating layers and sacrificial silicon nitride layers including a second silicon nitride material over the source select level silicon nitride layer;

forming a memory opening through the alternating stack and the source select level silicon nitride layer;

laterally recessing a sidewall of the source select level silicon nitride layer farther than sidewalls of the sacrificial silicon nitride layers employing an isotropic etch process that etches the first silicon nitride material at a greater etch rate than the second silicon nitride material;

forming a pedestal channel portion at a bottom region of the memory opening, wherein the pedestal channel portion contacts a remaining portion of the source select level silicon nitride layer;

forming a memory stack structure on the pedestal channel portion in the memory opening, wherein the memory stack structure comprises a memory film and a vertical semiconductor channel located inside the memory film; and replacing the source select level silicon nitride layer and the sacrificial silicon nitride layers with a source select level electrically conductive layer and word line electrically conductive layers, respectively;

wherein a ratio of an etch rate of the first silicon nitride material in the isotropic etch process to an etch rate of the second silicon nitride material in the isotropic etch process is greater than 1.5.

12. A method of forming a three-dimensional memory device, comprising:

forming a source select level silicon nitride layer including a first silicon nitride material over a substrate;

forming an alternating stack of insulating layers and sacrificial silicon nitride layers including a second silicon nitride material over the source select level silicon nitride layer;

forming a memory opening through the alternating stack and the source select level silicon nitride layer;

laterally recessing a sidewall of the source select level silicon nitride layer farther than sidewalls of the sacrificial silicon nitride layers employing an isotropic etch process that etches the first silicon nitride material at a greater etch rate than the second silicon nitride material;

forming a pedestal channel portion at a bottom region of the memory opening, wherein the pedestal channel portion contacts a remaining portion of the source select level silicon nitride layer;

forming a memory stack structure on the pedestal channel portion in the memory opening, wherein the memory stack structure comprises a memory film and a vertical semiconductor channel located inside the memory film; and replacing the source select level silicon nitride layer and the sacrificial silicon nitride layers with a source select level electrically conductive layer and word line electrically conductive layers, respectively;

wherein:

the three-dimensional memory device comprises a monolithic three-dimensional NAND memory device;

the word line electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the word line electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

* * * * *